(12) United States Patent
Tune et al.

(10) Patent No.: US 10,771,194 B2
(45) Date of Patent: Sep. 8, 2020

(54) INTERCONNECTION NETWORK FOR INTEGRATED CIRCUIT

(71) Applicant: Arm Limited, Cambridge (GB)

(72) Inventors: Andrew David Tune, Dronfield (GB); Guanghui Geng, Sheffield (GB); Zheng Xu, Austin, TX (US)

(73) Assignee: ARM Limited, Cambridge (GB)

( * ) Notice: Subject to any disclaimer, the term of this patent is extended or adjusted under 35 U.S.C. 154(b) by 125 days.

(21) Appl. No.: 15/989,226

(22) Filed: May 25, 2018

(65) Prior Publication Data
US 2019/0363829 A1 Nov. 28, 2019

(51) Int. Cl.
| | |
|---|---|
| *H04L 1/00* | (2006.01) |
| *H04L 12/707* | (2013.01) |
| *G06F 13/40* | (2006.01) |
| *G06F 17/50* | (2006.01) |
| *G06F 30/30* | (2020.01) |

(52) U.S. Cl.
CPC ........ *H04L 1/0061* (2013.01); *G06F 13/4027* (2013.01); *G06F 30/30* (2020.01); *H04L 45/22* (2013.01)

(58) Field of Classification Search
None
See application file for complete search history.

(56) References Cited

U.S. PATENT DOCUMENTS

| | | | | |
|---|---|---|---|---|
| 6,289,037 B1* | 9/2001 | Gibbons | ................... | H04B 1/69 375/130 |
| 6,625,764 B1* | 9/2003 | Dawson | ................... | H04L 41/24 714/703 |
| 6,771,605 B1* | 8/2004 | Law | ................... | H04L 49/3009 370/242 |
| 6,775,804 B1* | 8/2004 | Dawson | ................ | H03M 13/09 714/776 |
| 6,782,503 B1* | 8/2004 | Dawson | ................. | H04L 43/50 714/739 |
| 6,788,932 B2* | 9/2004 | Nakamichi | ........... | H04M 3/436 455/423 |

(Continued)

OTHER PUBLICATIONS

Extended European Search Report for EP Application No. 19171154.8 dated Oct. 17, 2019, 7 pages.

(Continued)

*Primary Examiner* — Phung M Chung
(74) *Attorney, Agent, or Firm* — Nixon & Vanderhye, P.C.

(57) ABSTRACT

An interconnection network for providing data transfer between a plurality of nodes of an integrated circuit comprises a number of endpoints for exchanging data with respective nodes of the integrated circuit, a primary network to route a primary payload from a source endpoint to a destination endpoint; and a redundant network to route, to the destination endpoint, a redundant payload comprising a first check code calculated based on at least a portion of the primary payload, the first check code having fewer bits than said at least a portion of the primary payload. The destination endpoint comprises error checking circuitry to perform an error checking operation to calculate a second check code based on the primary payload received via the primary network, and verify integrity of the primary payload based on a comparison of the second check code with the first check code received via the redundant network.

19 Claims, 10 Drawing Sheets

(56) References Cited

U.S. PATENT DOCUMENTS

| | | | |
|---|---|---|---|
| 7,420,926 B2* | 9/2008 | Law | H04L 49/3009 |
| | | | 370/242 |
| 10,187,794 B2* | 1/2019 | Vialen | H04W 12/0017 |
| 2010/0067415 A1* | 3/2010 | Simmons | H04L 1/0009 |
| | | | 370/310 |
| 2016/0191678 A1* | 6/2016 | Brandeburg | H04L 63/123 |
| | | | 370/392 |

OTHER PUBLICATIONS

Song Xiangming et al, "Configurable Redundant Routing for Network on Chip" *2012 Fourth International Conference on Computational Intelligence and Communication Networks*, Nov. 3, 2012, pp. 477-479.

Srinivasan Murali et al, "Analysis of Error Recovery Schemes for Networks on Chips" *IEEE Design & Test of Computers*, Sep. 26, 2005, pp. 434-442.

A. Patooghy et al, "LTR: A Low-Overhead and Reliable Routing Algorithm for Network on Chips" *2008 International SoC Design Conference*, Nov. 24, 2008, pp. I-129-I-133.

* cited by examiner

INTERCONNECTION NETWORK FOR INTEGRATED CIRCUIT

BACKGROUND

Technical Field

The present technique relates to the field of integrated circuits. More particularly it relates to an interconnect for providing data access between nodes of an integrated circuit.

Technical Background

An integrated circuit, for example a system on chip, may include a number of components which may communicate by issuing data access requests specifying a target address. An interconnection network may be provided which provides data transfer between nodes of the integrated circuit.

SUMMARY

At least some examples provide an interconnection network for providing data transfer between a plurality of nodes of an integrated circuit, comprising: a plurality of endpoints each to exchange data with a respective node of the integrated circuit; a primary network to route a primary payload from a source endpoint to a destination endpoint; a redundant network to route, to the destination endpoint, a redundant payload comprising a first check code calculated based on at least a portion of the primary payload, the first check code having fewer bits than said at least a portion of the primary payload; wherein the destination endpoint comprises error checking circuitry to perform an error checking operation to calculate a second check code based on the primary payload received via the primary network, and verify integrity of the primary payload based on a comparison of the second check code with the first check code received via the redundant network.

A storage medium may be provided to store an electronic design file representing a design of an interconnection network as discussed above. The storage medium may be a non-transitory storage medium.

At least some examples provide a computer-implemented method of generating an electronic design file representing a design of an interconnection network for providing data transfer between nodes of an integrated circuit; the method comprising: in response to design specification data identifying the nodes to be connected by the interconnection network, generating the electronic design file specifying that the interconnection network comprises: a plurality of endpoints each to exchange data with a respective node of the integrated circuit; a primary network to route a primary payload from a source endpoint to a destination endpoint; and a redundant network to route, to the destination endpoint, a redundant payload comprising a first check code calculated based on at least a portion of the primary payload, the first check code having fewer bits than said at least a portion of the primary payload; wherein the destination endpoint comprises error checking circuitry to perform an error checking operation to calculate a second check code based on the primary payload received via the primary network, compare the second check code with the first check code received via the redundant network, and signal an error when a mismatch is detected between the first check code and the second check code.

A storage medium may be provided to store a computer program for controlling a data processing apparatus to perform the method for generating the electronic design file discussed above. The storage medium may be a non-transitory storage medium.

Further aspects, features and advantages of the present technique will be apparent from the following description of examples, which is to be read in conjunction with the accompanying drawings.

DESCRIPTION OF EXAMPLES

Figure 1:
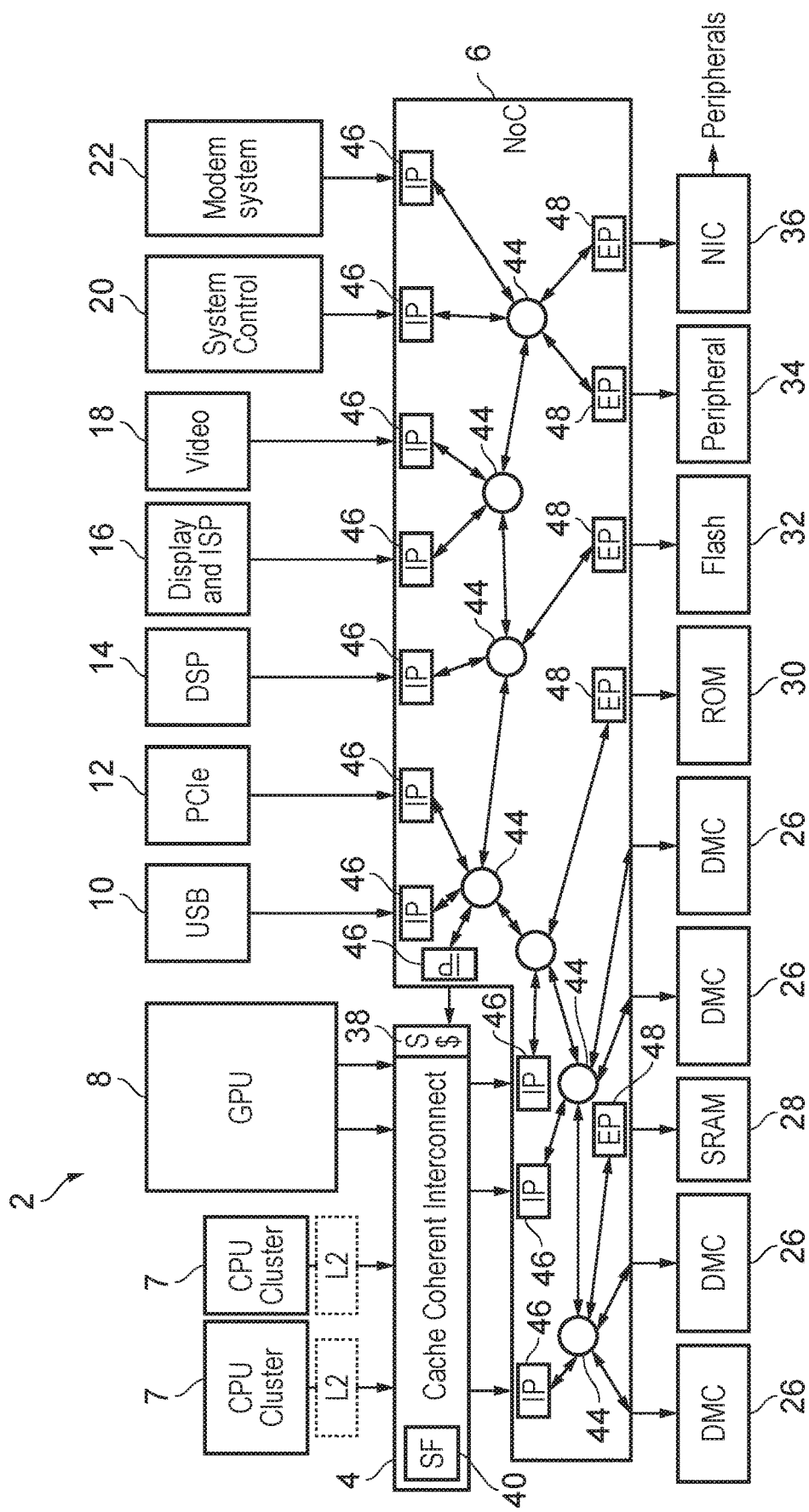
FIG. 1 shows an example of a data processing system including at least one interconnection network.

An interconnection network may be provided in an integrated circuit for providing data transfer between a number of nodes of the integrated circuit. For example the nodes connected by the interconnection network could include processor cores, graphics processing units, network controllers, etc. The network may have a number of endpoints each for exchanging data with a respective node of the integrated circuit, and transmission channels for routing payloads from a source endpoint to a destination endpoint. Optionally, the network could also include additional components, such as routers for selecting between alternative downstream transmission channels, data resizing components, and/or clock or power domain crossing units for bridging across clock or power domains.

Functionally correct integrated circuit designs may sometimes experience hardware faults, for example caused by an ionising particle striking a component of the circuit. If the fault occurs in the interconnection network, the fault may prevent the correct data reaching the appropriate destination, either due to the data changing value during transmission, or due to the data being misrouted so that it does not arrive (or is delayed in arriving) at the correct destination. The faults may include permanent faults, e.g. when a flip-flop or other storage element of the integrated circuit becomes stuck at a particular value regardless of the input to that storage element, causing subsequent signals dependent on that storage element to have a bit tied to 0 or 1. Also, the interconnection network could be subject to transient faults, e.g. where a bit of a transmitted value changes states during transmission due to a particle strike, but subsequently transmitted values are still correct as there was no permanent damage to the circuit hardware. Faults may also include wires stuck at a particular value, open wire faults, short circuit faults, and high-impedance wire faults.

In integrated circuits designed for applications where functional safety is important, such as automotive applications, it may be desirable to provide mechanisms for detecting the occurrence of faults in the interconnection network. One approach may be to replicate the components of a primary network for routing a primary payload from the source endpoint to the destination endpoint, to form an identical redundant network which may send a redundant copy of the primary payload to the destination in parallel with the primary payload itself, and compare the primary and redundant payloads received at the destination to check for errors. However, as the interconnection network may include many components, duplicating each component of the primary network in the redundant network is expensive in terms of checking logic and circuit area and also increases power consumption.

In the technique discussed below, the redundant network routes, to the destination endpoint, a redundant payload comprising a first check code calculated based on at least a portion of the primary payload, with the first check code having fewer bits than the portion of the primary payload used to calculate the first check code. The destination endpoint comprises error checking circuitry to perform an error checking operation to calculate a second check code based on the primary payload received via the primary network, and verifies integrity of the primary payload based on the comparison of the first and second check codes. Hence, rather than transmitting the entire payload redundantly over the redundant network, by transmitting a check code with fewer bits, this saves circuit area and reduces power consumption, enabling less expensive implementation of an interconnection network in an integrated circuit of system on chip designed for functional safety applications.

In some examples, the redundant network may route the redundant payload over a physically separate channel to the channel used by the primary network for the primary payload.

Alternatively, in some examples the primary network and the redundant network can share a common physical channel, but may use different virtual channels on the same physical channel, where each virtual channel corresponds to a portion of the bandwidth on the shared physical channel. The different virtual channels could for example have independent buffering of packets at certain components of the network so as to separate the primary payload packets from the redundant payload packets and provide for independent control over the flow of the primary payload packets and redundant payload packets. Even if a common channel is used for both the primary network and the redundant network, by separating in time the transmission of the primary payload and the redundant payload, then this can still provide protection against transient faults. For some classes of functional safety certifications it may not be essential to protect against permanent hardware results such as stuck-at faults, in which case sharing a common channel may be sufficient.

Nevertheless, providing separate physical channels for the primary and redundant networks can increase the robustness against faults, which may help to improve the percentage of faults that can be detected, and may be preferred for higher classes of functional safety certification.

In some examples the redundant network could transmit the redundant payload in parallel with the transmission of the primary payload on the primary network. In some cases the physical separation of the redundant network from the primary network may be sufficient to protect against faults to the degree required by a given level of functional safety certification. For example if the main and redundant networks use channels which are at physically remote locations on the integrated circuit then this can provide some robustness against common mode failures, as it reduces the chance of a single event such as a particle strike affecting both the primary payload and the corresponding redundant payload.

In other examples, the redundant network may delay transmission of the redundant payload relative to transmission of the primary payload on the primary network. This means that a transient fault on one of the primary and redundant networks is less likely to also affect the corresponding payload sent on the other network.

In some examples the primary network may comprise a portion comprising components clocked by a first clock signal and the redundant network may comprise a portion comprising components clocked by a second clock signal, where the second clock signal is independent from, but synchronous with, the first clock signal. For example, these portions of the primary and redundant networks may operate in lock step to provide a constant delay between the primary payload transmission and the transmission of the corresponding redundant payload on the redundant network.

In some examples, the entire primary network and redundant network may operate using synchronous clock signals.

However, in other examples the interconnection network may span multiple clock domains, to link components driven by clock signals for which at least one of the phase and frequency of the clock signal in one domain is misaligned with the phase and/or frequency of the clock signal in another domain. In this case, the parts of the main/redundant networks within the same clock domain may be driven by synchronous clock signals, but parts of the primary and redundant networks in different clock domains may operate using asynchronous clock signals having different frequencies or mesochronous clock signals having the same frequency but misaligned phase.

The primary payload may include, in addition to any data being transmitted, network control signals for controlling components of the primary network to route the primary payload from the source endpoint to the destination endpoint. For example, the network control signals could include information for defining the route which is to be taken from the source endpoint to the destination endpoint, information defining the size or format of the packets used to transport the primary payload, and/or any other information for orchestrating how the network should convey the payload. The redundant payload may comprise a subset of the network control signals for controlling components of the redundant network to route the redundant payload from the source endpoint to the destination endpoint. It may not be necessary to replicate all the network control signals used in the primary network within the redundant network. Hence, by providing components of the redundant network so that they transport the first check code and a proper subset (not all) of the network control signals, this allows the redundant network to be implemented more efficiently than if the redundant network simply duplicated the primary payload itself.

The error checking operation performed at the destination endpoint may be independent of at least one of the network control signals transmitted in the primary payload. That is, it is not necessary to check all the network control signals for errors. This is because if errors occur in some network control signals then this may simply result in incorrect routing of packets, so that packets may be lost or routed along the wrong path or to the wrong destination, or may be received out of order with respect to other packets to the correct destination endpoint. Such errors may be detectable through the comparison of the first and second check codes as discussed above, since the incorrect routing of either the primary payload or the redundant payload may result in the related primary/redundant payloads arriving at different destinations. In this case, the primary and redundant payloads arriving at a particular destination endpoint may actually relate to different instances of data transmission, and so the first check code received with the redundant payload may not match the second check code calculated from the received primary payload, so that the error can be detected even if the network control signal itself is not checked for errors. Hence, logic can be saved by not performing error checking at the endpoint for all of the network control signals.

The redundant network may include at least one intermediate component for routing the redundant payload from an upstream component to a downstream component. The upstream and downstream components could be one of the endpoints or could be a further intermediate component, depending on the number of intermediate components provided between the endpoints for a given path taken by a payload. At least for a synchronous intermediate component for which both the upstream component and the downstream components operate in response to synchronous clock signals (clocks aligned in both frequency and phase), the synchronous intermediate components may route the redundant payload from the upstream component to the downstream component independent of any comparison of the redundant payload with information derived from the primary payload transmitted on the primary network. Similarly, in the primary network synchronous intermediate components may route to the primary payload from an upstream component to a downstream component independent of any comparison with information derived from the corresponding redundant payload on the redundant network. Hence, it is not necessary to perform any comparison or checking of the primary payload and the redundant payload at synchronous intermediate components which bridge between components operating with synchronous clock signals. Since there may be large number of intermediate components in the network, by eliminating checking the primary payload against the redundant payload at every hop of the network, this can save a significant amount of circuit area and reduce power consumption. Instead, error checking can be performed at the destination endpoint to account for errors in transmission across the network.

In some implementations the network may also include some asynchronous intermediate components where the component is located between an upstream component and a downstream component which operate in response to clock signals for which one or both of the phase and frequency of the clocks is misaligned. Some implementations may regenerate check codes at such an asynchronous intermediate component, to ensure that any fixed delay required for a lockstep scheme to be valid can be enforced despite the uncertainty in the relative timings of the misaligned clocks at the upstream and downstream components. In this case, a comparison of the primary and redundant payloads received from the upstream component may be performed at the asynchronous intermediate component to check whether the regenerated check code to be sent downstream from the asynchronous intermediate component can be trusted. Hence, there may be some intermediate points within the network where there may need to be a connection between the primary network and the redundant network, in order to verify a second check code calculated based on the primary payload against the first check code included in the redundant payload before the first check code is regenerated in the downstream clock domain based on the primary payload.

Nevertheless, by restricting such links between the primary and redundant networks to the endpoints and the asynchronous clock domain boundaries, and eliminating such links (checks between the main and redundant payloads) at synchronous intermediate components, this can save circuit area and improve power consumption. Also, this may reduce the need for as many long paths connecting logic in physically remote areas of the integrated circuit, which can make it easier to partition the logic so that the redundant network can be placed in a power saving mode when functional safety is not required, for example by power gating or clock gating the redundant network.

The first check code and the second check code may comprise a type of check code capable of detecting multi-bit errors in the primary payload or the redundant payload. Although it is likely that single event upsets such as those caused by particle strikes would only trigger a single bit to change state in a transmitted signal, if such a bit flip occurs in routing control signals then this can result in more than one bit of the transmitted payload being incorrect or the entire payload arriving at the wrong time relative to other signals, which could cause the wrong primary payload to be compared with the redundant payload or vice versa. Hence, to comply with higher classes of functional safety certification, it may be required to use a type of check code which is capable of detecting multiple bit errors in the same data value.

A range of types of error correction code may be used for this purpose. It can be particularly useful to use a convolutional code to calculate the first/second check codes. Convolutional codes can be useful because they can be generated by a sliding application of a function to a data stream. Hence, it is not necessary to have all of the payload available at the same time at the logic calculating the check code. Instead, a provisional check code can be calculated for the initial portion of the payload, and updated in response to each successive portion of the payload, until the entire payload has been processed and the check code resulting from the final calculation is the value which is used as the first check code to transmit on the redundant network.

A particularly useful example of a convolutional code is a cyclic redundancy check (CRC) code, which is a convolutional code which also provides multi-bit error detection and can detect a relatively high percentage of errors with a code of relatively few bits. It is been found that a CRC with a relatively small number of bits, for example 8 bits, can be sufficient to comply with the highest level of functional safety certification, ASIL-D, so that it can detect around 99.6% of multi-bit errors and 100% of single bit errors and bursts of error length 8 or less.

The primary payload may be transmitted on the primary network in units called packets. Each packet may, for example, comprise a header defining certain properties of the packet and a packet payload providing the data to be transmitted. For example, the header could be defined according to a network protocol which may define multiple layers of signals, such as physical layer signals defining formatting of the packet and link layer signals defining how to route the packet across the network. The transported payload in the primary payload could include not only data but also other information derived from the request sent by the requesting node to the source endpoint at which the original request was received, such as address information or other information carrying characterising a memory access request.

Each packet may comprise a certain number of flits, where a "flit" (or "flow control digit") is the smallest unit of information for which the network can control routing independently from other flits. In some systems each packet could simply comprise a single flit and in this case routing control (selection of the particular route taken through the network by a particular flit) and flow control (control of the timing at which bandwidth on the network is used for transmitting a particular flit) could simply be performed on the granularity of packets. However in systems supporting packets comprising multiple flits, each flit could independently be routed and/or held back from transmission if a downstream component is not ready to receive the flit.

Some systems may support packets with a fixed number of flits. In some cases each flit may have a fixed size (number of bits).

However, for increased flexibility some interconnection networks may support packets with variable numbers of flits of variable size. For example the network could include at least one resizing component for resizing flits of the primary payload to flits of a different size. For example some of the nodes connected to the network could operate with data channels of different bit width, and so it can be desirable to reformat the packets being transmitted on the network to the appropriate width for the data channel which will be used to transmit the data from the destination endpoint to the corresponding destination node of the integrated circuit.

The source endpoint may calculate the first check code as a packet check code for checking contents of the entire packet. The first check code may be a type of check code which, for a given volume of data to be transmitted in the packet, is invariant to the number of flits used to transmit the given volume of data in the packet. This means that even if the packet is passed through the resizing component on its way through the network, and the data from the packet ends up being redistributed across a different number of flits, the check code generated for the packet prior to resizing may still be correct, so that there is no need to regenerate the check code at the resizing component. This again saves circuit area and power consumption by limiting the points of the network at which the check code needs to be recalculated.

Each flit may itself be divided into a number of flit sections and each flit may include a variable number of flit sections. A flit section may have a predetermined size.

In some cases, although a certain number of flit sections may be defined for a given flit, there may not be enough valid data to fill all of those flit sections, and in this case certain flit sections may be invalid. The primary payload may specify flit section validity information indicating which flit sections comprise valid information. When the network includes a resizing component as discussed above, it is possible that some invalid flit sections may be discarded at the resizing component in order to fit the valid data into packets with different sized flits. To avoid having to recalculate the first check code, it can therefore be desirable to use a check code calculation which omits any invalid flit sections from the calculation of the first check code. For example the source endpoint (or the asynchronous intermediate component as discussed above) which calculates (or regenerates) the first check code may comprise coalescing circuitry to coalesce any valid flit sections of a given flit into a contiguous block of data for input to the calculation of the first check code. This means that even if some invalid flit sections are omitted at a resizing point of the network then the previously calculated first check code remains valid and can simply be transmitted to a downstream component without recalculation. This saves circuit area and power by reducing the number of points in the network where the check code has to be recalculated (and hence avoiding the need for additional code checking logic and long wired paths linking the primary and redundant networks at the resizing points—instead the resizing of flits on the primary and redundant networks can be performed independently).

In some examples, although flits of the primary packets on the primary network may include a variable number of flit sections, each fit of the redundant payload transmitted on the redundant network may comprise a single flit section regardless of the number of flit sections in each flit of the primary payload. As the first error check code transmitted in the redundant payload has fewer bits than the corresponding portion of the primary payload used to calculate the first check code, then in practice the redundant packets do not need to transmit as much data. Hence, if the size of a flit section is chosen to be sufficient to accommodate the redundant payload including any header information required for routing the check code across the redundant network, then there is no need to include more than one flit section even if the corresponding primary packet does include multiple flit sections per flit. By restricting the size of a redundant packet to a single flit section, this enables narrower physical channels to be used in the redundant network compared to the network links in the primary network, saving circuit area and hence power. Alternatively in approaches where the redundant and primary network share a common physical channel, using only a single flit section per flit could enable some buffer space or logic corresponding to unused bits to be placed in a power saving mode when the redundant payload is being transmitted, compared to the full buffer/logic capacity used when the primary payload is transmitted. Hence, restricting redundant flits to a single flit section enables power to be saved.

The redundant network may transmit the redundant payload comprising the same number of flits as the corresponding packet of the primary payload. Even if the redundant payload could be transmitted in a single flit of a single flit section, it may be desirable to equalise the number of flits per packet in the primary and redundant networks, to maintain a constant time relationship between the primary and redundant payloads. This enables lockstep components to operate assuming there is a fixed delay between the receipt of the primary payload and receipt of the corresponding redundant payload. Lockstep can be a useful technique for enabling functional safety, not only in the interconnection network itself but also in downstream components, so by providing a redundant payload protocol which mirrors the number of flits in the primary payload, this simplifies the implementation of such lockstep components.

Hence, if the number of fits of the primary payload is greater than a minimum number of flits required to transmit the redundant payload, then the source endpoint may include in the redundant payload at least one padding flit which provides dummy data or non-redundantly transmitted data which is independent of the data of the primary payload. The padding flits could comprise zeros or other meaningless dummy data. Alternatively the spare bandwidth in the padding flits could be reused to transmit some additional information not provided by the primary payload, for which the functional safety provided by the redundancy between the main and redundant networks is not required. For example, non-safety-critical data (e.g. information for controlling an audio system in an automotive vehicle) could be transmitted using the spare padding flits of the redundant payload, as for the non-safety-critical data it may not be essential that errors are detected. By reusing the spare bandwidth within the padding fit for useful purposes this can improve the overall utilisation of the network.

In some interconnection networks, the format of packets on the network itself may be the same as the format of packets received from the requesting node of the integrated circuit that is connected to the source endpoint. However, in some systems the requesting node could use a different protocol to the internal protocol used within the interconnection network. For example, the requesting node could provide data on a data channel and a header on a separate header channel. For example, the header could provide a memory address for the memory access and the data channel could provide the corresponding data. On the other hand, the network itself could use a combined packet format where both the header (address) and the data are combined into the same packet. Note that the header received on the header channel at the source endpoint may be a different piece of information to the packet header appended to the network packet by the source endpoint—the header on the header channel may be defined according to the source protocol used by the requesting node, while the header in the packet may be defined according to the network protocol used in the interconnection network itself. Hence, in some cases the data and header received from the requesting node may be combined to form a primary payload. Similarly, the destination endpoint could extract separate data and header (address) information and then output them on separate data and header channels to a destination node connected to the destination endpoint.

In systems where separate data and headers are combined to form a primary payload and headers are combined from primary payload, this can make the calculation of the check code more complex. One approach could be to serially process the data and the header, so that an intermediate check code is calculated based on one of the header and the data and then the intermediate check code is then modified based on the other of the data and the header. However this approach would be slow and increase latency.

Hence, in some cases a source endpoint may calculate a data channel check code based on the data received on the data channel, and independently calculate a header channel check code based on the header channel based on the header received on the header channel. The data channel check code and the header channel check code can then be combined to form the first check code which has been routed across the network via the redundant network. The data channel check code and header channel check code can be calculated in parallel, to reduce latency.

However, when the first check code is to be compared against the second check code at the end the destination endpoint, the destination endpoint may obtain the combined data from the transmitted primary payload and calculate the second check code based on that combined data, and so may assume that either the header is at more significant bit positions than the data or vice versa. Hence, the source endpoint may need to generate a first check code which replicates the calculation performance by the destination endpoint, and so may need to assume that one of the data and header have been shifted to bit positions more significant than a most significant bit than the other of the data and the header. This can be done by transforming one of the data channel check code and the header channel check code to generate a transformed check code which corresponds to the shifted check code which would have been generated had the source endpoint processed the data and header channels sequentially rather than in parallel. For example a binary constant matrix may be calculated to emulate the effective shift of one of the data and the header and the corresponding one of the data channel check code and the header channel check code can be multiplied by that precomputed matrix in order to apply the transformation. In some implementations it may be the data channel check code which is transformed (i.e. it is assumed that the header is at less significant bit positions than the data). Alternatively, the header channel may be transformed to emulate a shift to more significant bit positions than a most significant bit of the data.

The technique discussed above can be implemented in a physical interconnection network which represents the actual component to be included in the integrated circuit.

However the technique can also be embodied within a non-transitory storage medium which stores an electronic design file representing a design of an interconnection network as discussed above. In general, the electronic design file may specify the components to be included in the interconnection network, including the endpoints, primary network and redundant network as discussed above. The electronic design file could represent the interconnect at a low level, such as representing individual gates or transistors to be comprised by the interconnect, or could be represented at a higher level of abstraction, for example identifying certain basic blocks of components to be laid out within the interconnect, with each block corresponding to a certain known design of gates or transistors which can later be read by accessing a cell library which provides the gate level layout for each standard block. Using electronic design files to control the automated manufacture of integrated circuits can be useful because the number of transistors or gates in an integrated circuit in modern systems is so vast that a human designer is unlikely to be able to keep track of the detailed design of the overall system. By using the electronic design file the human designer can focus on higher level abstractions and design considerations, while the individual gate level representation can be filled in later by a computer based on previously prepared standard cells providing the gate level representation of basic blocks of components which can be combined in different combinations to provide the functionality required by the designer. The electronic design file can then be used to control the manufacturing equipment to actually manufacture the integrated circuit. Hence, in some cases the electronic design file may be provided by an integrated circuit developer to a manufacturer to instruct the manufacturer to manufacture their integrated circuit according to the specified design. Hence, the interconnect represented within such a design may have any of the features discussed above embodied within the data structures of the design file.

FIG. 1 schematically illustrates an example of a data processing system 2 (e.g. an integrated circuit or system-on-chip) having data access routing circuitry 4, 6 for routing data access requests between requesting nodes and destination nodes and routing the responses to such data access requests from the destination nodes to the requesting nodes. In this example the system 2 includes a number of master devices, such as: one or more central processing units (CPUs) 7 or clusters of CPUs; a graphics processing unit (GPU) 8; a USB master 10 for controlling interaction with devices over a universal serial bus (USB); a PCIe controller 12 for controlling interaction with devices connected to the system 2 over a PCI Express bus; a digital signal processor (DSP) 14; a display controller and/or image signal processor 16; a video controller 18; a system controller 20, which could provide a number of system control functions such as controlling direct memory access operations, controlling security operations such as encryption or other on chip security operations, or controlling interaction with peripherals; and a modem system controller 22 for controlling communications via a modem. All of the masters 7 to 22 may be capable of acting as a requesting node for issuing data access requests to be serviced by a destination node of the system.

The system may have a number of components which may act as destination nodes, for example including a number of memory controllers 26 for controlling access to dynamic random access memory (DRAM); a memory controller 28 for controlling access to static random access memory (SRAM); a memory controller 30 for controlling access to a read only memory (ROM); a flash memory controller 32 for controlling access to flash memory; a peripheral controller 34 for controlling access to peripheral devices; and a network interface controller 36 for controlling interaction with remote devices or further peripherals via a network interface. Also the destination nodes may include a system cache 38 within the data routing circuitry 4, 6, which can cache some data from the memory system 26-36 so that some data access requests can be serviced without needing to pass them on to a downstream memory component.

In the example of FIG. 1, some of the masters 7, 8 are coupled via a cache coherent interconnect 4 which is responsible for managing coherency between cached data held by the respective master's caches. The cache coherent interconnect may have a snoop filter 40 for tracking data cached in particular masters' caches and may respond to read and write data access requests specifying a target address by issuing snoop transactions to check for the coherency status of data associated with the target address cached in other masters, so that if one master requests read or write access to data, then data for the same address in another master's cache can be invalidated, or if dirty, the latest value in that other master's cache can be provided to the requesting master and/or written back to the memory system. Any known coherency protocol could be used for the cache coherent interconnect 4.

The other masters 10 to 22 (which may not comprise a cache) do not need to be connected via the cache coherent interconnect 4. A system interconnect 6 couples the outputs of the cache coherent interconnect 4 and the non-cached masters 10 to 22 with the respective destination devices 26 to 36. The system interconnect 6 is used for routing of transactions to a target destination node selected based on the target address specified by the request, and for routing of the responses back to the requesting node. In the arrangement shown in FIG. 1, the system interconnect 6 does not need to take responsibility for management of coherency between cache data in respective masters. However, in other examples, instead of providing a separate cache coherent interconnect 4 and system interconnect 6 as shown in FIG. 1, a single interconnect similar to the system interconnect 6 could be provided which connects each of the master and slave devices and also manages cache coherency.

In this example, the system interconnect 6 is implemented as a network on chip (NoC) which comprises a number of routers 44 for coupling a number of master interfaces 46 (from which data access requests, including read and write requests, can be received from respective master devices 7-22) to a number of destination interfaces 48 (for outputting the requests to respective destination devices 26-36). Each master interface 46 (also known as an ingress port, IP, or source endpoint) is responsible for decoding the address specified by the data access request to identify the particular route to be taken through the network on chip 6 via the routers 44 to reach a destination interface 48 associated with the selected destination node which is to service the data access request. In some cases the master interface 46 may also translate the protocol used for the request asserted to the network on chip 6 into an internal representation to be used for routing the request across the network on chip 6. If the requests are translated into an internal protocol, then the destination interfaces 48 (also known as egress ports, EP, or destination endpoints) may translate them back into the original protocol used by the request in order for servicing by the destination. Alternatively, some of the destination nodes may handle the request directly in the form used by the network on chip 6 so that no translation would be needed at the destination interface. For each destination interface 48, when it receives the response to a data access request from the destination node 26-36, the destination interface 48 issues that response back along the path taken by the corresponding request to the master interface 46 which issued the request, and the master interface 46 then returns the response to the requesting node.

A network on chip 6 as shown in FIG. 1 can be useful when there are a large number of master and destination devices to be connected, as the arrangement of routers 44 can be designed bespoke for the requirements of a given system in order to provide for an appropriate level of bandwidth and to provide sufficient number of routers that the physical distance over which requests have to be routed on the chip can be accommodated without significant loss of signal amplitude. For pairs of requesting and destination nodes which are expected to require a large amount of traffic then additional routers or signal channels can be provided between them, while other pairs of requesting/destination nodes may have less capacity.

The use of a network on chip is not essential and in other examples a different topology could be used within the system interconnect 6. For example, a series of point to point connections between the master and destination interfaces could be used, or a ring topology may be used in which all requests are asserted onto a ring bus and then circulate round until they reach the required target interface. Also, a mesh topology could be used where each interface 46, 48 is connected to a point on a grid and requests and responses may traverse between the points on the grid associated with the corresponding master and destination interfaces 46, 48. However, use of a network on chip can enable better scaling as the number of master and destinations increases.

Although FIG. 1 shows an example of a network for routing signals between master and slave devices within an integrated circuit, in other examples the devices connected by the interconnect may not have a master-slave relationship, but instead the devices could be connected by peer-to-peer connections. Also, in some examples some requests routed by the network may target a destination node within the interconnect itself, such as points of coherency or caches, rather than targeting a destination node outside the interconnect.

Figure 2:
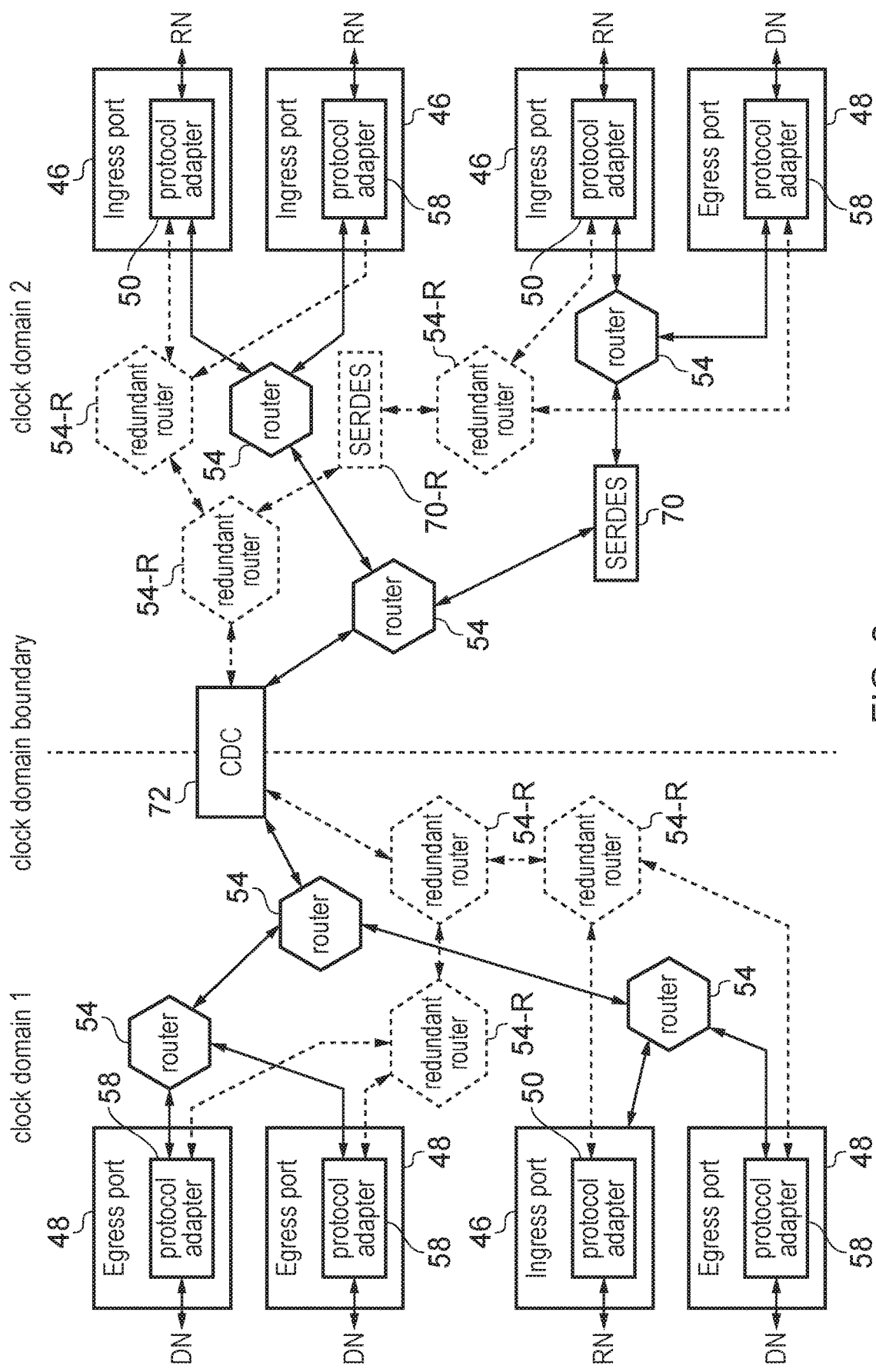
FIG. 2 shows an example of an interconnection network comprising a main network and a redundant network.

FIG. 2 shows an example of components on the network on chip (NoC) 6 in more detail. The NoC 6 comprises a number of components which can be combined in different layouts and arrangements depending on the particular arrangement of master devices and destination devices which are to be connected by the NoC 6. For example this may include any of the following components:

Ingress Port (Source Endpoint) 46

The ingress port receives data access requests from a requesting node coupled to the ingress port. For example the ingress port may act as one of the master interfaces 46 shown in FIG. 1. The ingress port 46 may decode a target address as specified by the data access request received from the requesting node to identify which egress port 48 should be selected for handling the request, and generates routing information for controlling the routing of the request across the NoC to the selected egress port 48. Also, as requests routed within the NoC 6 may use a different protocol to the protocol used by the requesting nodes for the data access requests, the ingress port may include a protocol adapter 50 for translating the request into the transport protocol used on the network. The ingress port 46 transmits the translated packets onto the network accompanied by routing information identifying how network packets corresponding to the request should be routed across the NoC. The ingress port 46 may also provide other functions such as managing resource allocation for particular requests, and controlling a quality of service level provided for requests from different sources so as to balance the competing needs of different master devices for bandwidth on the network. For example the ingress port 46 may have various buffers for buffering tracking information relating to requests and buffering responses to the requests. The ingress port 46 may control allocation of resource and issuing of requests based on availability of space in the buffers, and based on the quality of service requirements (e.g. providing a limit to the number of currently outstanding transactions that can be pending at a given time, or a limit to the number of transactions from a given requesting mode which are serviced within a given period).

Router 54

Each router 54 is responsible for routing packets received from one component of the NoC 6 and selecting which other component the packet should be directed to, based on the routing information specified by the packets which has been appended to the packet by the ingress port 46 at which the corresponding request originated. The particular arrangement and number of routers 54 that are provided may depend on the particular system requirements. For example, if ingress and egress ports are separated by a large distance on the integrated circuit then more routers may be required to provide sufficient repetition of packets to maintain signal level when the packets reach their destination. Also the topology in which the routers are connected may be selected based on expected bandwidth requirements for particular pairs of ports 46, 48.

Egress Port (Destination Endpoint) 48

The egress port 48 receives the network packets representing data access requests that were generated by the ingress port 46 and routed across the NoC via the routers 54. The egress port 48 has a protocol adapter 58 for translating the transport protocol of the network packets back into the protocol used by the destination node to which the egress report is connected. Some forms of request may not require a response from the destination node. However, for requests which do require a response (e.g. a read response, a write response or both), when a response to a data access request is received from the destination node which has serviced the data access request, the responses can be adapted for the transport protocol of the network by the protocol adapter 58 in the egress port 48 and then output onto the network by the egress port 48. In some cases, the response packets may be routed back to the ingress port 46 which received the original data access request which triggered those responses, e.g. along a corresponding path to the one taken by the data access request packets but in the reverse direction, or on a different path. In other cases, the response packets may be routed to a different ingress port as they may sometimes need to be provided to a different requesting node to the requesting node that issued the original request (e.g. due to a change in coherency state in the caches of the respective masters). Hence again the protocol adapter 58 may append routing information specifying the route to be taken by the response packets. When these response packets are received at the ingress port 46, the protocol adapter 50 converts them into the responses expected by the requesting nodes and forwards them onto the requesting node.

Note that in some examples the functions of the ingress/egress ports may also be handled at a network bridge component (at the boundary between two network portions), so that the network bridge may effectively act as both an ingress port and an egress port for at least some purposes.

Data Resizer 70

It may be needed to resize data values being transmitted across the network when being provided from one component to another. For example a packet comprising a smaller number of flits could be spilt into a packet comprising a greater number of flits of a smaller data size, or a packet comprising smaller flits could have flits combined or repartitioned into a smaller number of flits of greater size. If the resizing is such that the number of input flits and the number of output flits follows a many-to-one or one-to-many relationship then the resizer 70 may act as a serialiser-deserialiser (SERDES) as shown in FIG. 2. However, it is also possible for resizers to provide an M:N resizing of data flits where both N and M are greater than 1, and in this case a more general resizer may be provided to map the data associated with a certain group of input flits to the data associated with a different number of output flits. In some embodiments, it may also be possible to convert a certain number of received packets to a different number of packets to be transmitted on the remaining part of the network.

Clock Domain Crossing (CDC) 72

As shown in FIG. 2, the NoC 6 may span multiple clock domains with components in one clock domain operating according to a clock signal which is different in one or both of the frequency and phase to the clock controlling the components in another clock domain. For example, the respective clock signals in the different clock domains could be asynchronous signals which have different clock frequencies, or could be mesochronous clock signals which have the same frequency but are offset in phase. At a clock domain boundary, the misaligned clocks mean that simply connecting the signal in the upstream domain to the corresponding signal path in the downstream domain could risk the downstream domain sampling the signal at the wrong timing relative to the clock of the source domain. The CDC 72 can provide buffers (one on the upstream domain side and another on the downstream domain side) for temporarily storing the transmitted information to allow the downstream domain to sample the received data at the correct timing relative to its clock. An asynchronous hand shake mechanism may be used to control the timing when data passes from the upstream buffer to the downstream buffer, so that the data can safely be transmitted over the clock domain boundary.

Redundant Network Components

As shown in FIG. 2, in addition to the components 54, 70, 72 defining the primary network for routing of primary payloads across the NoC, the NoC also comprises a redundant network which partially duplicates at least some of the primary network components of the primary network. For example, in FIG. 2 the network includes a number of redundant routers 54-R which mirror the corresponding main routers 54 of the primary network. Also the data resizer 70 of the main network may have a corresponding redundant network data resizer 70-R. The clock domain crossing 72 may have both main and redundant channels within it to allow the main and redundant signals to bridge across the clock domain boundary, but may also include cross-checking circuitry to check the redundantly transmitted payload against the primary payload at the CDC 72. The ingress ports 46 and egress ports 48 are also not duplicated as the ingress port 46 is responsible for taking the request received from receiving node and mapping it to the corresponding primary and redundant payloads, and the egress port 48 extracts the information from the primary and redundant payloads and maps this information to an ongoing information to be transmitted to the destination node. By providing a redundant network which provides redundant information which at least partially replicates information travelling on the primary network, this can be used for error checking at the egress ports 48 to determine whether a permanent or transient fault has occurred during routing of the primary payload or the redundant payload which may potentially cause incorrect operation.

It will be appreciated that the network-on-chip 6 could also include other components not shown in FIG. 2.

One approach for implementing redundancy for functional safety purposes could be for the redundant network to duplicate each component the primary network and route, as the redundant payload, an exact copy of the primary payload. However, this may be expensive in terms of additional processing logic and circuit area as each redundant router 54-R and other redundant components 70-R may have to be expanded, and as there are many such components in a typical NoC, this may cause a great increase in circuit area.

Figure 3A:
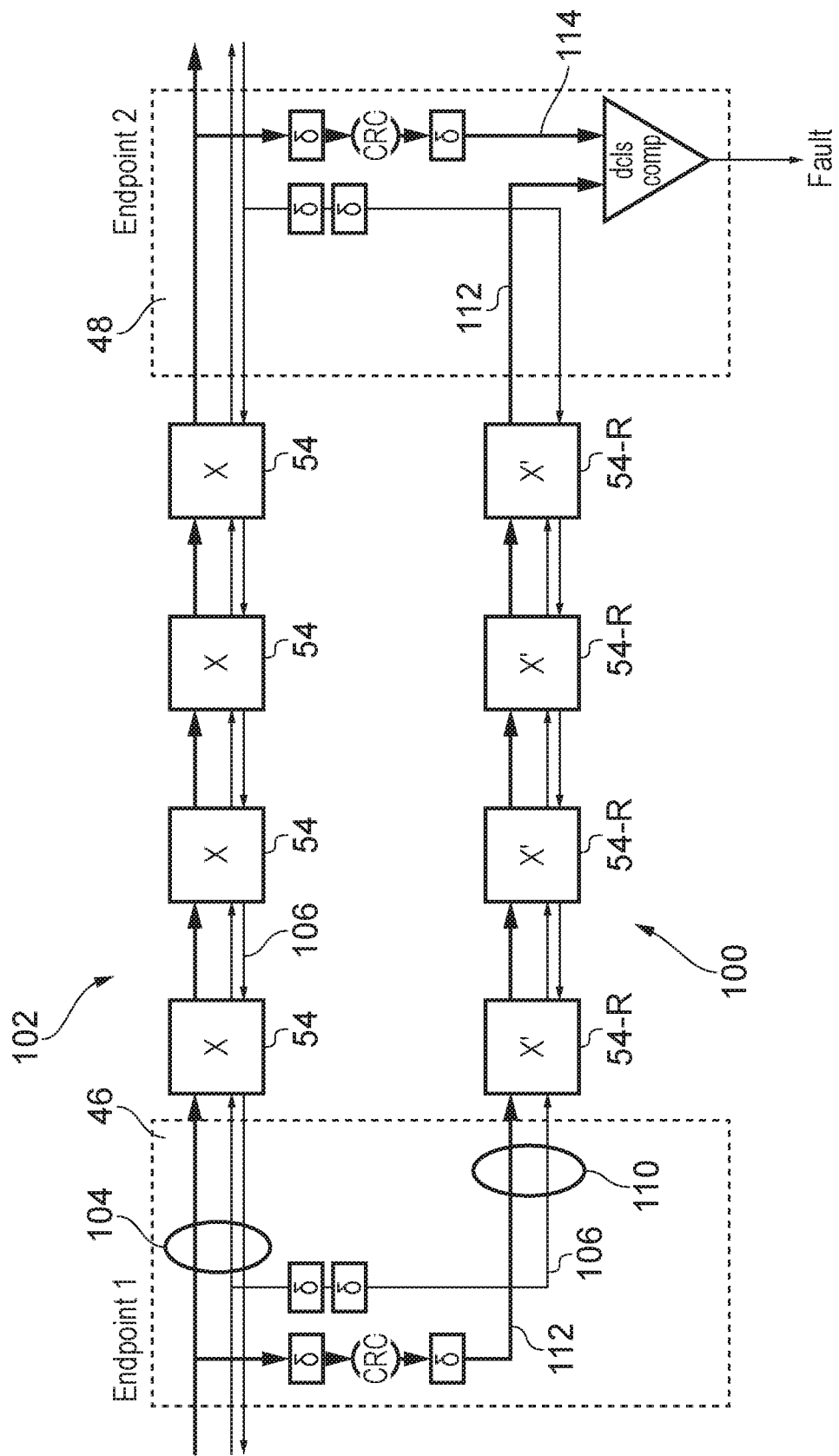
FIG. 3A schematically illustrates an example of error checking using the primary network and the redundant network.

FIG. 3A illustrates an example for providing error protection with reduced area overhead. The primary network 102 formed of a number of primary network components used to transmit the primary payload 104 from the source endpoint (ingress port) 46 to the destination endpoint (egress port 48). The primary payload is the payload providing the actual data to be sent to the destination endpoint. In this example, for conciseness only the path of the network linking the source endpoint to the destination endpoint is shown (clearly the network will also comprise other paths linking other pairs of endpoints). Also, for conciseness in this example the network components are shown as a sequence of routers 54 for selecting which downstream path to send the payload to, but it will be appreciated that the network path could also include other types of network component. Also, in some network implementations which provide at least some point-to-point connections directly linking a corresponding pair of endpoints, such point-to-point paths may not include any routers between the endpoints.

In addition to the payload data the primary network 102 may also transmit network control information 106 which is used for controlling the routing of the primary payload across the network. For example these control signals 106 may specify a route vector which identifies a specific sequence of routers (or other network components) to be traversed by the primary payload as it crosses the network, and/or information defining the size or format of the packets transmitted.

The redundant network 100 transmits a redundant payload 110 which is delayed relative to the corresponding primary payload being transmitted on the primary network 102. Rather than duplicating the entire primary payload 104 as the redundant payload 110, the redundant payload 110 comprises at least a subset of the network control signals 106 used for controlling routing of the payload, and a first check code 112 which provides a digest of the primary payload 104. The digest has fewer bits than the corresponding portion of the primary payload used to calculate the digest. For example, the first check code 112 may be a convolutional code, for example a cyclic redundancy check (CRC) code calculated based on at least a portion of the primary payload 104. A CRC with a relatively small number of bits, such as 6 or 8 bits can provide a sufficiently high probability of detecting both single-bit errors and multiple bit errors to enable the interconnection network to comply with the higher classes of functional safety certification needed for applications such as automotive processes. It will be appreciated that other types of error checking codes could be used other than CRC's, e.g. a SECDED ECC (single error correcting, double error detecting error correction code) or a DED (double error detecting) code. In general, a form of code should be selected that is capable of detecting multiple erroneous bits which are incorrect within the same data value (e.g. a parity code may not be sufficient). As the redundant network 100 transmits the redundant payload 110 which uses a digest error check code 112 with fewer bits than the corresponding portion from the primary payload from which it is calculated, the redundant routers 54-R and other redundant network components can be implemented more efficiently in hardware and need less complex control logic and narrower data channels and registers, saving circuit area.

When the primary payload 104 reaches the destination endpoint 48 then it is subject to the same error checking code calculation as performed at the source endpoint 46, and the resulting second error check code 114 is compared against the first error check code 112 which is received over the redundant network 100. If there is a mismatch between the first error check code 112 and the second error check code 114 then a fault can be signalled, and a fault handling response triggered. For example, the fault handling response may comprise requesting retransmission of the data, signalling that an error has occurred to the requesting node that initiated the request, or signalling that the error has occurred to a separate error-handling component. In some implementations, it may not be necessary to signal the fault to the requesting node (or even to the source endpoint) when an error is detected. For example, some network protocols could transmit, for each request, multiple copies of the same information (and hence also multiple copies of the corresponding redundant payloads), so that if an error is detected from a mismatch in check codes for one pair of main/redundant payloads, one of the other identical copies of the main/redundant payload for which the codes do match can be used to generate the information to be transmitted to downstream circuitry from the destination endpoint. Also, in some systems (e.g. automotive) it may not be necessary to actually correct the error, as long as any incorrect actions triggered by the erroneous values are halted, as updated values may be transmitted periodically during real time system control, and so if a value detected at one time, is incorrect the system may continue based on the previously transmitted values until the next time an updated value is transmitted. Hence, in some cases the response action taken may simply be to prevent the erroneous value being written to an actuator for triggering an action. Also, in some cases the response action may be to update an error log tracking errors that have occurred.

FIG. 3A shows an example where a lockstep approach is taken, with the redundant and primary networks clocked with independent, but synchronised, clock signals, and the transmission of the redundant payload 110 on the redundant network 100 delayed relative to the transmission of the primary payload 104 on the primary network 102. In other examples no delay may be provided between the primary and redundant transmissions, as in some cases the physical separation of the two channels may be enough to provide robustness against common mode failures (a common mode failure occurs when a single cause of fault, such as a particle strike, results in errors in both the primary payload and the related redundant payload). For example, if the corresponding components of the redundant and primary networks are physically remote on the system chip then this may reduce the vulnerability to common mode failures.

While FIG. 2 shows an example where the redundant network has the same topology as the primary network, this is also not essential and in some cases the redundant network could take a different topology. In this case there may be some difference between the network control signals 106 provided on the primary and redundant networks. For example a route vector indicating the sequence of routers to be traversed may be different on the redundant network compared to the primary network.

In summary, in FIG. 3A reduced redundant versions of intermediate NoC components such as routers are provided, in which control logic is replicated but instead of payload, only an error detecting code is processed. At least some network control signals (e.g. link layer (LINK) and physical layer (PHY) signals) are replicated and used as inputs to the redundant versions. An error detecting code (EDC) based on the payload is input at the source endpoint. At the destination endpoint, another EDC is generated from the primary payload and compared with the EDC that has passed through the NoC. Any discrepancy indicates a fault. No DCLS (dual core lock step) comparisons nor EDC checks are used at intermediate nodes: Error detection and reporting is only needed at the endpoints. An advantage is that, because the payload signals and the redundant EDC are sent in lockstep, DCLS error checking is not required on at least some of the LINK and PHY-layer signals. Most types of errors on these layers will result in the EDC and primary data to which it relates being either misaligned or mismatching. The ECD code chosen is one that can detect multi-bit errors of kinds that may occur in the intermediate logic (unless it is used over a single link without intermediate components, in which case, parity may be adequate). The NoC may incorporate in-network width conversion.

Figure 3B:
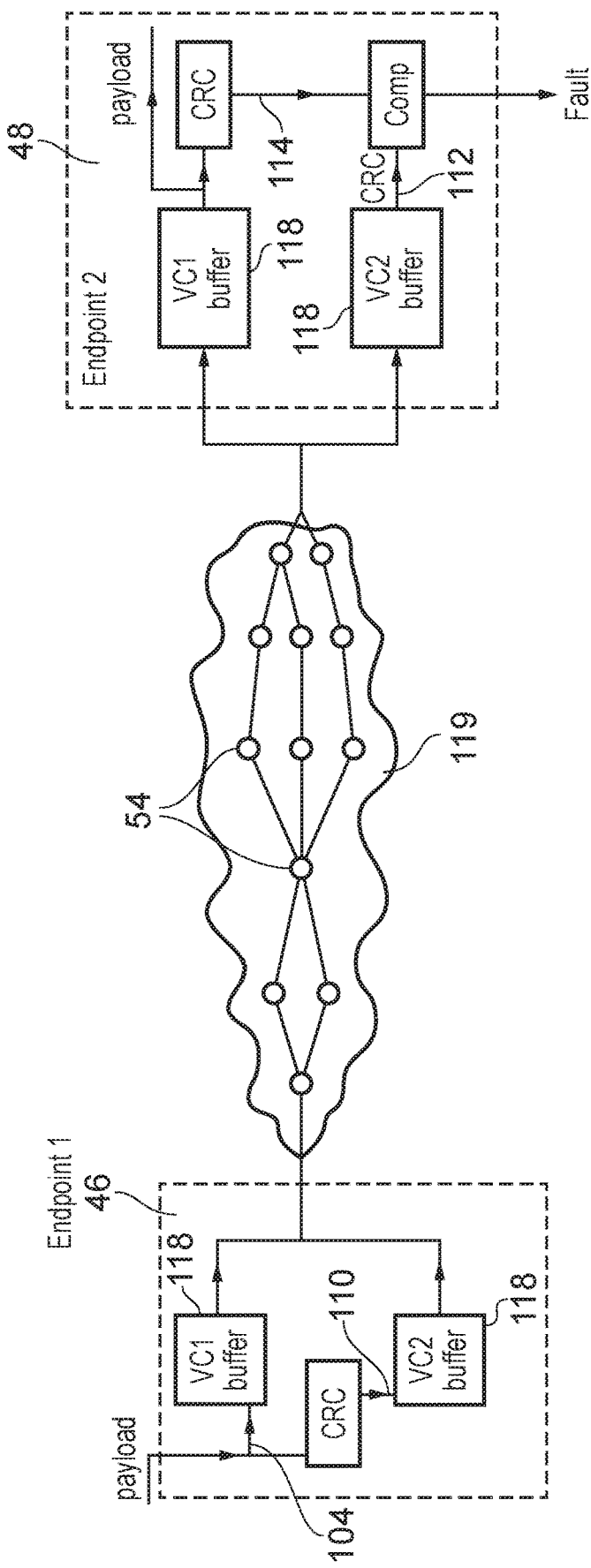
FIG. 3B shows an alternative example in which the primary and redundant networks comprise first and second virtual channels on the same physical channel.

While FIG. 3A shows the redundant network as a physically separate channel from the main network 102, this is not essential, and in some cases the redundant network could at least partially reuse the same physical channel used for the main network. For example, as shown in FIG. 3B, a network component such as the endpoints 46, 48 could have buffers 118 corresponding to a number of virtual channels sharing the same physical transmission channel 119. As shown in FIG. 3B, the shared physical transmission channel 119 could include multiple paths through the shared network with routers 54 or other network components selecting which specific paths are used for each payload transmitted. Such routers 54 on the shared physical channel may themselves also have virtual channel buffers 118 similar to the endpoints. By providing separate buffers 118 for independently buffering packets associated with each virtual channel, independent flow control can be applied (e.g. by an arbiter associated with the component having the buffers) to control when the bandwidth on the common physical channel is used for each virtual channel. Each network component may hold packets or flits within the buffer associated with a given virtual channel until the arbiter allows the given virtual channel to have another time slot on the shared physical channel. Unlike the approach shown in FIG. 3A, by using virtual channels, there is no need to provide a dedicated separate redundant network which cannot be used by the primary payload, so this approach can reduce the circuit area cost of implementing the redundant error checking functionality.

In an arrangement using virtual channels as shown in FIG. 3B, the primary payload 104 and the redundant payload 110 comprising the first error check code 112 can be mapped to packets on different virtual channels, for example with the primary payload 104 sent over virtual channel 1 and the redundant payload 110 sent over virtual channel 2 in the example shown in FIG. 3B. Once each payload has been received in the corresponding virtual channel buffers 118 at the destination endpoint, the second error check code 114 can be generated from the primary payload received on virtual channel 1 and compared against the first error check code 112 received over the other virtual channel 2, and a response action can be triggered if there is a mismatch as discussed above for FIG. 3A.

The network components may use a priority scheme to determine when a given physical channel can be used for transmitting packets of each virtual channel. In some examples, the virtual channel carrying the redundant payload 110 may be assigned a higher priority than the virtual channel carrying the primary payload 104, so that on arbitrating between the virtual channels, the virtual channel carrying the redundant payload is preferentially selected. This means the redundant payload 110 carrying the error check code 112 is likely to traverse the network to arrive at the destination endpoint 48 ahead of the corresponding primary payload 104, ready for comparison with the primary payload 104 when the primary payload arrives. While it may seem counter-intuitive to prioritise the error check code ahead of the primary payload 104 (one would think it is most important to avoid delaying the primary payload 104), in practice this means the primary payload 104 is unlikely to be significantly delayed relative to the normal timing at which it would have been received if no error checking was performed (as while it is possible the redundant payload could slightly delay the primary payload, it is less likely that other intervening packets would delay the primary payload by any more delay than would be incurred if the redundant payload had not been sent). In contrast, if the primary payload 104 was prioritised ahead of the redundant payload 110, it is possible that intervening packets on a virtual channel having a priority greater than the virtual channel used for redundant payload, but less than the virtual channel used for the primary payload 104, could effectively delay the primary payload (even though they are lower priority), because they cause a delay in the transmission of the redundant payload which means the primary payload has to wait so that the error check codes can be compared. Counterintuitively, the delay in the primary payload 104 caused by such intervening packets can be reduced by transmitting the redundant payload 110 on a virtual channel with a higher priority than the virtual channel used for the primary payload 104.

Some network components may have multiple output ports for transmitting payloads to a subsequent network component on the common transmission channel 119. Ports may be shared between virtual channels, so that a given port coupled to a given downstream component could be used for either virtual channel 1 or virtual channel 2, say. When transmitting the primary and redundant payloads 104, 110 over different virtual channels, at least one network component may select different output ports for the corresponding primary and redundant payloads 104, 110, so that the primary payload 104 for a given transmission may take a different route across the network compared to its corresponding redundant payload 110. For example, a different sequence of routers may be selected for the redundant payload 110 on virtual channel 2 compared to the primary payload 104 on virtual channel 1, but eventually both payloads 104, 110 may be received at the destination endpoint 48. This can help to reduce the extra latency caused by error checking compared to sequentially transmitting the primary and redundant payloads 104, 110 on the same port, as it may allow the primary and redundant payloads 104, 110 to be transmitted at least partially in parallel over different branches of the common network 119.

If at least one virtual channel (e.g. virtual channel 2 in FIG. 3B) is assigned to transmitting the redundant payload 110 only, then the buffers 118 at each network component associated with that virtual channel may have a smaller storage capacity than the buffers 118 associated with other virtual channels used for the primary payload 104, as the error check code and control information transmitted in the redundant payload 110 may have fewer bits than the corresponding data and control information transmitted in the primary payload 104. By reducing the size of the buffers 118 in the virtual channels reserved for redundant payload transmission, this helps to reduce circuit area.

As discussed in more detail below, the EDC applies to the whole packet and may be transmitted only once per packet, typically with the last flit. The last flit comprises an identifier which is replicated in the redundant logic. The redundant data transmission may be padded with null flits to maintain lockstep. In some implementations, other data can be transmitted in these flits but otherwise, to save power, logic can be arranged so that these padding flits do not activate register writes.

For example, a CRC-8 may be computed across the entire payload (taking in to account the position of the valid words, as described further below). For random errors, a well-chosen CRC can give c. 99.6% detection rate for multi-bit errors and 100% detection of single bit errors and bursts of error of length 8 or less.

This scheme has the advantage that no connections between the primary and redundant NoC components are needed except at the endpoints. This may simplify implementation, by avoiding long paths connecting logic in domains that are usually on separate, but synchronous clocks. It also makes it easier to partition the logic so that the redundant part can be powered or clocked off when functional safety is not required.

Although in the example FIG. 3A the only point at which the check codes 112, 114 are compared is at the destination endpoint 48, in some networks having a clock domain crossing (CDC) 72, there may also be an additional check at the CDC 72 to determine whether the first check code 112 transmitted on the redundant network matches a second check code calculated from the primary payload transmitted on the primary network 102. This is because, in order to implement a lockstep functionality in components downstream of the clock domain crossing, it may be useful to regenerate the redundant signal in the downstream clock domain side of the CDC 72. The delay between the primary and the redundant transmissions may need to remain constant at components operating in lockstep, so that it can be trusted that the comparison logic is actually comparing the related primary and redundant payloads (rather than payloads corresponding to different information). When signals cross a clock domain boundary, the misaligned clocks mean that the timing of sampling the redundant payload in the downstream domain may vary relative to the sampling of the primary payload. By regenerating the check code at the CDC in the downstream clock domain, the relative delay between the main and redundant payloads can be restored. However, in this case an additional check of the redundantly transmitted first check code received from the upstream clock domain against a second check code calculated from the primary payload may be performed at the CDC 72, to check whether any error has occurred in the portion of the network leading to the CDC 72 or in the CDC 72 itself. Otherwise, any previously occurring error may not be detected at the destination endpoint as the regenerated check code would be generated at the CDC 72 based on already erroneous primary data and so would match the erroneous primary data, preventing error detection.

Hence, the CDC 72 may check whether the primary and redundant payloads match by comparing the check codes, and if there is a match, regenerate the first check code for the redundant payload from the received value of the primary payload in the downstream clock domain, to restore the correct timing between the primary and redundant payloads. With regard to the check code checking and regeneration, the CDC 72 effectively acts as both a destination endpoint (checking the code received from the actual source endpoint) and a source endpoint (generating the check code to transmit to the actual destination endpoint), effectively dividing the overall path taken into multiple sections each with a separate code generation, transmission and checking sequence. Hence, in some cases the CDC 72 could be regarded as a source endpoint or destination endpoint.

Figure 4:
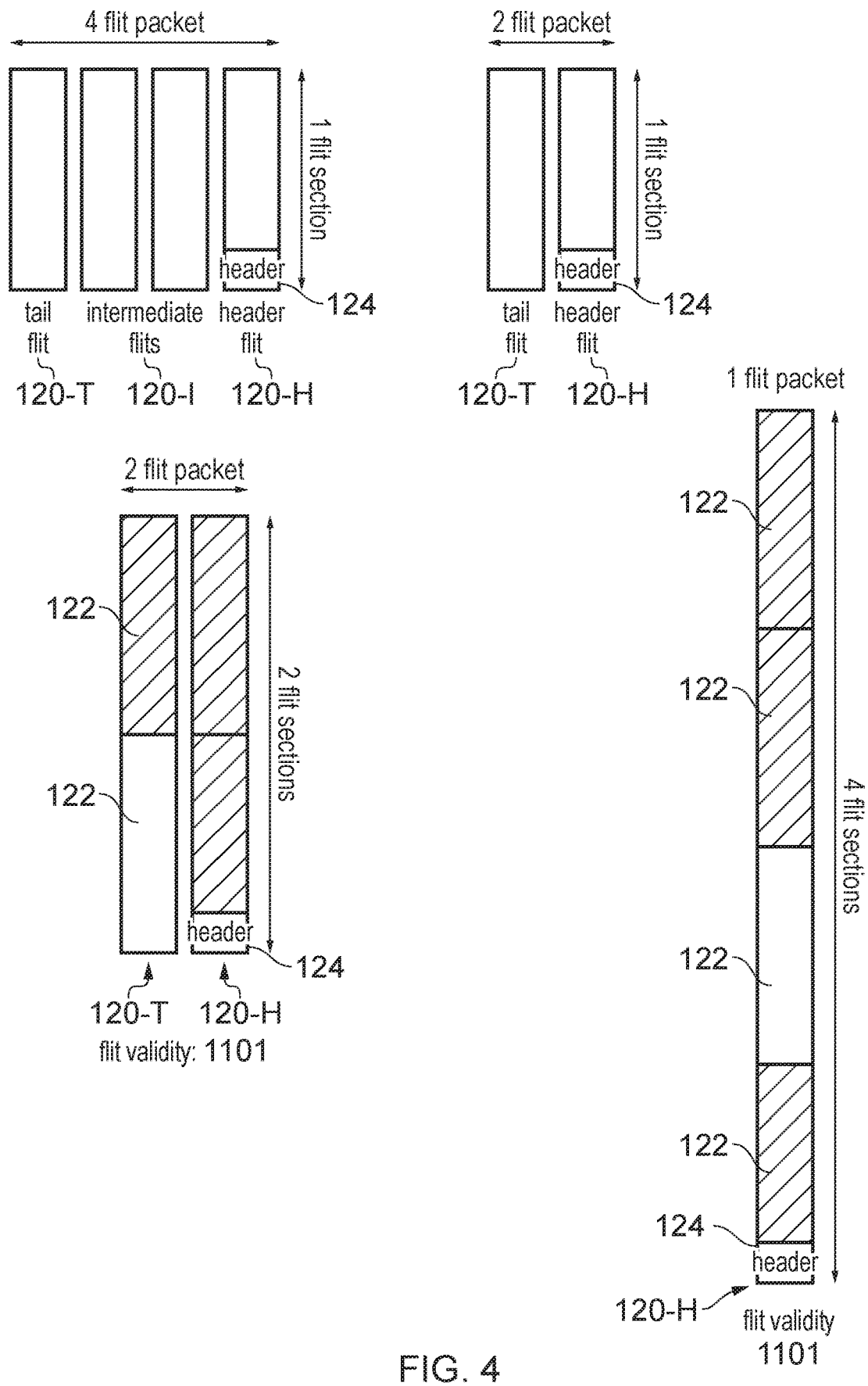
FIG. 4 shows an example of transmitting a primary payload with variable numbers of flits per packet and variable numbers of flit sections per flit.

As shown in FIG. 4, the primary payload may be transmitted on the primary network using a packet format which transmits data in packets having a variable size and format. A packet may be a unit of data transmission generated at an ingress port in response to a given request from a requesting node. Each packet may have a separate header providing information about the format of the packet. The packet may be formed of one or more flits (or flow control digits) 120. A flit is the smallest unit of data for which routing and/or flow control of the flit through the network can be controlled independently of routing of other flits. For example the network may include mechanisms to delay transmission of the next flit if there is no room in a downstream component to accept the flit.

Each flit 120 may be formed from one or more flit sections 122 of a given base unit size. Hence the size of each flit 120 is variable. FIG. 4 shows several examples of possible packet formats. The upper two examples show packets with flits 120 comprising a single flit section 122. The lower two examples provide 120 flits with 2 or 4 sections 122. Providing a variable size of flit can be useful for enabling different parts of the network to use physical channels of different bit widths. This can be useful for allowing some portions of the network which are expected to require a high volume of traffic to be made with wider physical channels with less intensively used portions of the network.

Also, some packet formats may provide packets with a greater number of flits 120 than other formats. FIG. 4 shows different examples with 1-flit, 2-flit or 4-flit packets respectively. It will be appreciated that these are just some examples of possible pocket formats. By permitting a packet to be formed from a variable number of flits, this can be useful for handling cases where different ingress/egress ports may have different sized interfaces with a corresponding node of the integrated circuit 2, and for in-network width conversion. For example some upstream or downstream components may require data to be provided over a wider or narrower channel. Hence, by varying the number of flits per packet based on the size of the data received from the requesting node or to be transmitted to the destination node, this enables the overall packet size to be increased or decreased as required.

In packet formats having a single flit, that flit 120 acts as a header flit 120-H comprising packet header information 124 identifying the format of the packet. The header flit may comprise one or more flit sections 122 (including the first flit section specifying the header), which may provide further payload data. For packets comprising multiple flits 120, the packet includes at least a header flit 120-H and a tail flit 120-T. If the packet comprises more than two flits, then the packet also includes one or more intermediate flits 120-I. The intermediate flits 120-I or tail flits 120-T allow the packet to provide additional data following the header flit 120-H. Regardless of the packet format, the header 124 specifies information for controlling routing of the packet, e.g. identifying the destination endpoint and route. In some examples, the header 124 could also define information indicating the format of the packet, e.g. the number of flits and/or number of flit sections per flit. However, in other examples the number of flits could be specified instead by a flag included in the tail flit 120-T to indicate that the tail flit 120-T is the final flit of the packet. The number of flit sections per flit may be specified in PHY layer signals associated with each flit.

Also, the packet may specify flit validity information indicating which of the flit sections 122 of the respective flits 120 contain valid data. The flit validity information for the packet could be specified in the packet header 124, or alternatively flit validity information relating to a particular flit can be specified within that flit itself. Depending on the way in which the packet is assembled at the protocol adapter 50 of the ingress port 46 (or at data resizers 70), some of the flit sections may not comprise any valid data. Optionally, invalid flit sections 122 may be discarded partway across the network by data resizers 70 if necessary. The data resizer 70 may be responsible for any changes of packet format required at intermediate points at the network in order to adapt the packet format used by one part of the network to a different packet format used in another part of the network.

In addition to physical layer signals specifying the format of the packets, the header 124 could also include link layer signals which specify information for controlling the routing of the packets across the network, for example including a route vector for identifying the sequence of routers 54 to be traversed, identifiers of the source endpoint 46 and destination endpoint 48 between which the packet is routed, and/or quality of service information which may flow control (e.g. affecting arbitration or prioritisation between different packets competing for bandwidth on the network).

While in FIG. 4, the header 124 is for conciseness shown solely in the header flit 120-H, in some cases some of the header information could also be provided in each subsequent flit to indicate properties of that flit. Also, in some implementations the header could span multiple flits.

The redundant payload on the redundant network 100 could be transmitted using exactly the same packet format as the primary payload on the primary network. However, as the redundant payload may be much smaller than the primary payload (as the first check code 112 to be transmitted in the redundant payload may be much smaller than the original data from which it was calculated), simply reusing the primary packet format for the redundant payload may waste space and require unnecessarily wide physical channels within the redundant network in regions of the network where a wide physical channel is provided on the primary network.

Figure 5:
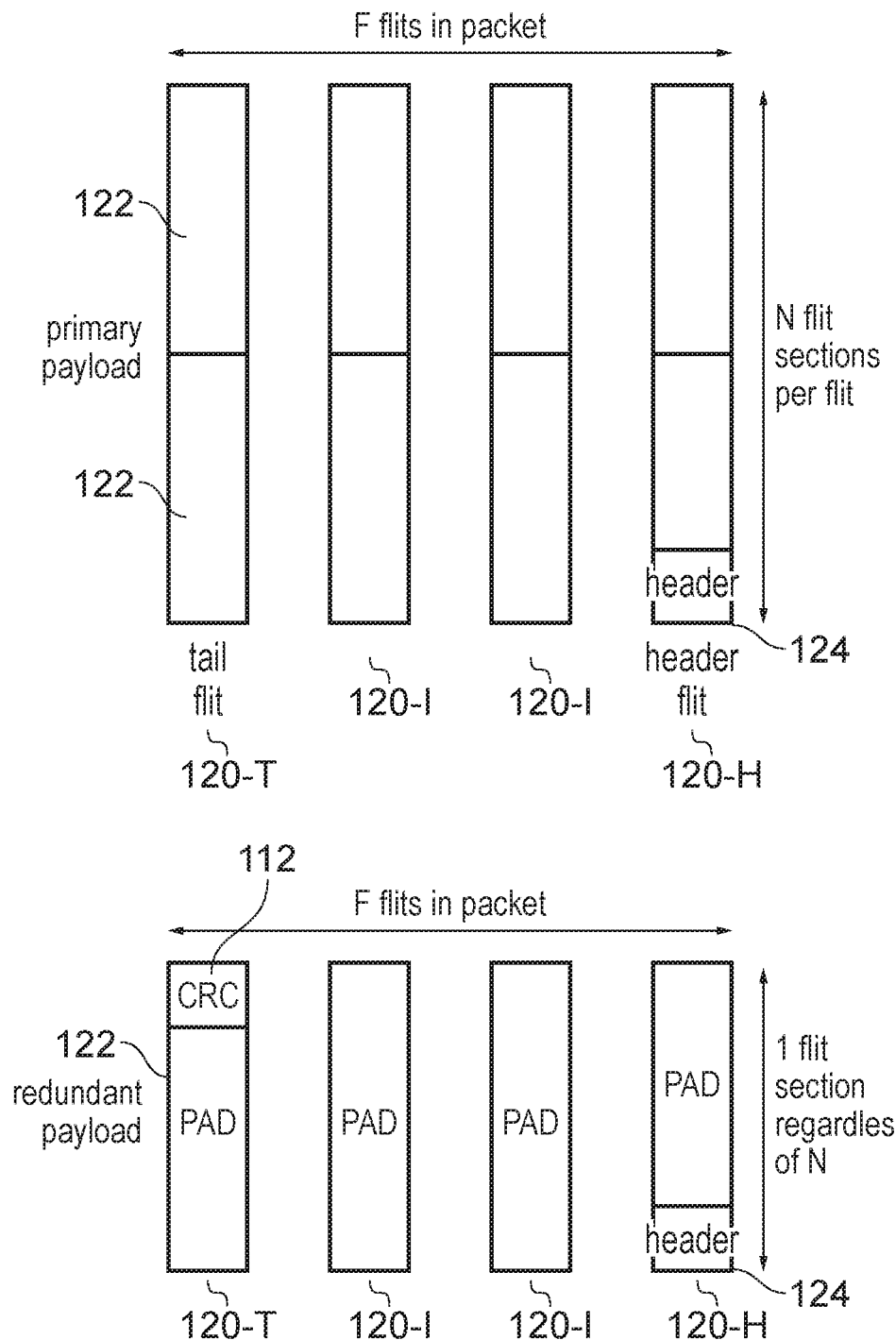
FIG. 5 shows a primary payload and a corresponding redundant payload.

Instead, as shown in FIG. 5, the redundant payload may use a different packet format to the primary payload. Where the primary payload uses a packet format with F flits 120 per packet and N flit sections 122 per flit, the redundant payload may comprise the same number, F, of flits 120 per packet, but may provide 1 flit section 122 per flit regardless of the value N defining the number of flit sections 122 per flit in the primary packet format.

The redundant payload may include a header 124 which replicates at least the physical (PHY) layer signals of the header 124 of the primary payload (optionally some link layer signals may be omitted, although a route version of the route vector which controls the routing through the routers of the redundant network may still be provided). Also the redundant payload includes the first check code 112 generated at the source endpoint 46 (or generated at a CDC 72). The first check code 112 may be provided in the tail flit 120-T of a packet, as it may be calculated convolutionally as each flit is processed and transmitted and so cannot be fully calculated until the whole packet has been processed. The combined size of the header 124 and the first check code 112 may be small enough to fit inside a single flit section 122 (so that if the primary payload comprises a single flit packet, both the header 124 and first check code 112 can be included in a single flit of the redundant payload). Hence, there is no need to provide a flit with more than one flit section. By restricting each flit 120 in the redundant pay load to a single flit section 122 regardless of N, the number of flit sections per flit in the primary payload, this avoids the need to provide as wide channels for the connections of the redundant network as are provided in the main network, saving circuit area by reducing the width of wired connections as well as registers for latching signals received over the connections and any comparison logic for example.

In cases where the primary payload comprises more than one flit in the packet, although the redundant payload could fit within the header flit 120-H alone, one or more padding flits 120-I or 120-T are included to equalise the number of flits in the redundant payload to match the number of flits in the primary payload. This is useful because this ensures that the relative time offset between receipt of a given flit after the primary payload and receipt of the corresponding flit of the redundant payload remains constant throughout the packet so that any dual core lockstep functionality can operate correctly on the assumption that the offset in time between the corresponding transmissions remains deterministic. In contrast, if the number of flits per packet in the redundant payload differed from those of the primary payload then this could result in timings on the redundant side varying relative to the primary side.

Although the padding flits of the redundant payloads do not need to transport any valid data, they could also be used to transport some other data which is independent of the primary payload and which does not need to be protected against errors caused by bit flits or other transient or other permanent faults. For example the space in the padding flits could be reused to provide non-safety critical data for which it is not a problem if the data gets corrupted. Alternatively, if there is no non-safety critical data to transmit then the padding flits could simply be filled with zeros or some other dummy data which is meaningless and discarded on receipt at the endpoint. Hence, for the redundant resizer 70-R of the redundant network, the resizing performed may comprise inserting or removing padding flits to match the number of flits being transmitted in each packet of the primary payload, but there may be no need to actually resize the number of flit sections per flit. In contrast, the primary resizer 70 on the main network may also carry out resizing of the number of flit sections per flit. If the number of flit sections per flit changes in the primary network, the primary resizer 70 may redistribute the data of a given packet amongst the number of flits provided in the new packet format, to ensure that all the data in the received packet may be transmitted in a different format to downstream components.

The CRC calculation of other check codes calculation from the endpoint may use a form of check code which is invariant to its resizing of the flits and packet reformatting performed by the resizer 70. That is, the check code 112 may be calculated over an entire packet, rather than providing individual check codes per flit.

A CRC is an example of a check code which has the property that, when calculated for a given volume of data (such as the overall packet size to be transmitted), the code calculated is invariant to the number of flits into which that volume of data is divided. For example the CRC may be calculated convolutionally so that the latest value of the CRC is updated in response to each successive flit received, and then the CRC resulting from the final flit indicates the check code for the entire packet. The CRC may have the same value regardless of whether, say, the packet is divided into a certain number of flits of a certain size, or into double the number of flits each of half the size, or half the number of flits each of double the size. Hence, by defining the check code 112 over the entire packet and using a type of code with this invariant to the number of flits used to transmit a given volume of data, this means that the check code arriving at the destination endpoint 48 will be the same regardless of the resizing applied by the data resizer 70 so that there is no need to recalculate check code at the data resizer 70. This is useful, because any recalculation of the check code would imply that the previously received check code would need to be checked against the second check code derived form the primary payload, which would hence require a connection between the primary network and the redundant network, which would increase circuit area. Hence, using a check code which is invariant to packet structure (provides the same code regardless of the number/size of flits into which a given size of packet is divided) can help to improve area efficiency.

Figure 6:
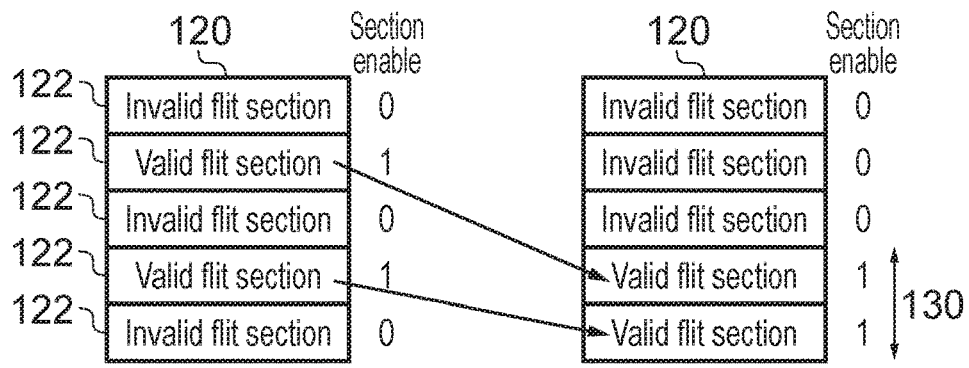
FIG. 6 illustrates an example of coalescing valid flit sections into a contiguous block for input to an error check code calculation.

The check code calculation can also be made invariant to the position of any valid flit sections 122 within a given flit 120. As shown in FIG. 6, circuitry calculating the check code (which could be included in the source endpoint for generating the first check code 112, in a clock domain crossing 72 which regenerates the first check code 112 in the downstream clock domain, or in the destination endpoint 48 for generating the second check code 114 to be compared against the first check code 112) may coalesce the valid flit sections into adjacent bit positions, to form a contiguous block 130 of valid data which is input to the check code calculation. By making the valid flit sections occupy contiguous bit positions, this means that even if during transmission across the network the data resizer 70 discards some invalid flit sections or inserts additional invalid flit sections to accommodate any changes of packet format required, the calculated check code is invariant to the presence of those invalid flit sections and to the particular arrangement of valid and invalid flit sections within the packet. Again, this means that there is no need to recalculate check codes at the resizer 70, which saves circuit area for the reasons given above.

In one example, the register state update to update the CRC block based on processing of one flit can be represented by the equation:

$$X_1 = F^{VT} \cdot X_0 + F_{T1}' \cdot D_{sT-1} + \ldots + F_{2I}' \cdot D_{s1} + F_I' \cdot D_{s0} \qquad \text{(Equation 1)}$$

where $X_0$ is the current register state representing the intermediate CRC generated from any previous flits, $X_1$ is the updated state representing the new intermediate CRC resulting from the current flit (or the final CRC if the current flit is the final flit of the packet), $D_{si}$ is data of the $i^{th}$ valid flit section, $F_{(i+1)I}'$ is a binary matrix constant to be applied to the $i^{th}$ valid flit section (the binary matrix constant can be pre-computed and each flit section has its own matrix constant). There are T sections in the flit in total, of which V are valid, so the binary matrix constant $F^{VT}$ depends on how many flit sections are valid.

Figure 7:
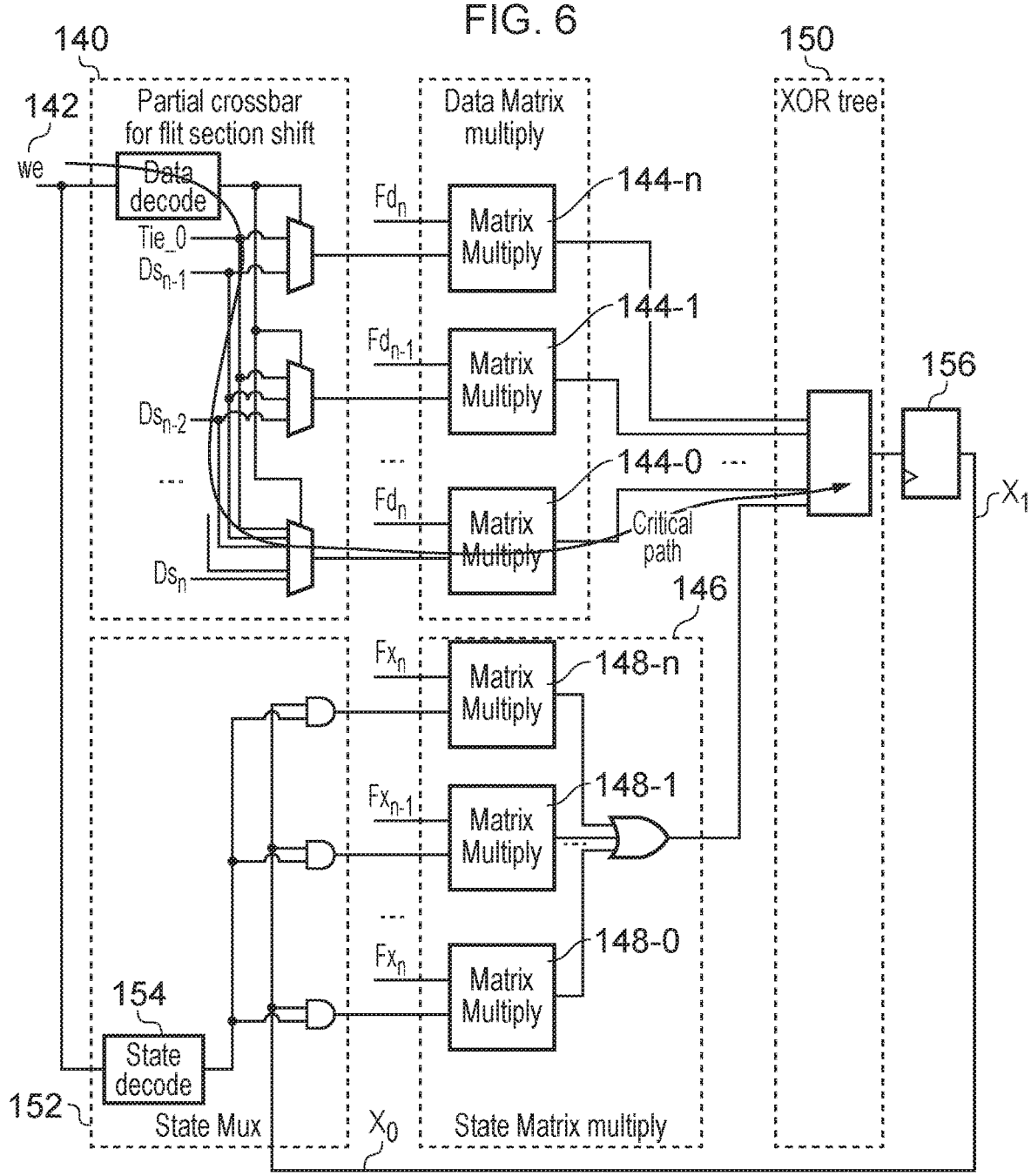
FIG. 7 shows an example of circuitry for performing the coalescing.

FIG. 7 shows a particular example of circuit implementation for carrying out this coalescing. The check code calculating circuitry (which can be included in the ingress port 46, egress port 48 or CDC 72) includes a cross bar circuit 140 to select, based on flit section validity information (we) 142 specifying the position of the valid flit sections 122, which flit sections to input to a number of matrix multipliers 144 for calculating the check code (each matrix multiplier 144 providing one of the multiplications $F_{(i+1)I}' \cdot D_{si}$ from Equation 1 shown above). Hence, the cross bar circuit 140 supplies the first valid flit section in the flit to the first matrix multiplier 144-0, supplies the second valid flit section to the second matrix multiplier 144-1, and so on. If there is at least one invalid flit section, the final matrix multiplier 144-$n$ (and possible one or more other multipliers 144) is supplied with zeroes as the input to the multiplier, so that the output of the multiplier will not affect the final output. Hence, regardless of the positions of the valid flits, the valid flit sections are input to the matrix multipliers corresponding to a contiguous block corresponding to the least significant bit positions in the flit. In other words, the crossbar circuit 140 masks off post-shift invalid data input to the block of data matrix multipliers 144. An alternative would be to mask off the matrix multiplier outputs (instead of their inputs), which would be more area efficient. However, masking of the inputs to the matrix multipliers 144 as shown in FIG. 2 is better for timing (reducing latency).

A state matrix multiplier 146 is provided to implement the additional multiplication $F^{VT} \cdot X_0$ from Equation 1 shown above. As $F^{VT}$ is dependent on the number of valid flit sections, values $Fx_0$ to $Fx_n$ (corresponding to each of the possible values of $F^{VT}$ for different values of V) are supplied to corresponding state matrix multipliers 148-0 to 148-$n$ for multiplying with the previous intermediate check code state $X_0$. A state multiplexer 152 comprises a state decoder 154 to decode the flit validity information 142 to determine V, the number of valid flit sections, and comprises logic to mask off the intermediate check code state $X_0$ supplied to all state matrix multipliers 148 other than the matrix multiplier 148 which corresponds to the actual number of valid flit sections. Hence, all but one of the outputs of the state matrix multipliers 148 will be zero and the other output provides the correct value of $F^{V_1} \cdot X_0$ for the relevant number V of valid flit sections. The output of the state matrix multiply block 146 is combined with outputs of each of the data matrix multipliers 144, using an XOR tree 150, to provide the addition of the various terms required by Equation 1. The result of the XOR tree is the new CRC value $X_1$ which is latched in register 156. In a subsequent clock cycle, the new CRC value $X_1$ from the previous cycle is used as input $X_0$ for the state matrix multiplication.

It will be appreciated that the example circuit of FIG. 7 is just one implementation and other implementations could achieve the same result for calculating the CRC.

Figure 8:
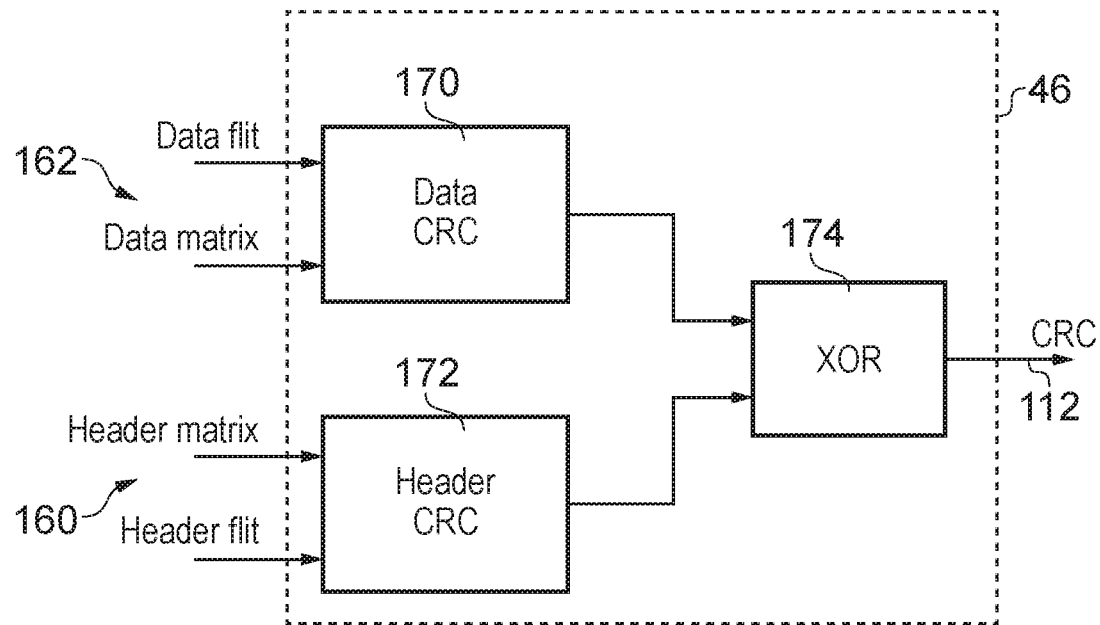
FIG. 8 shows an example of calculating independent error check codes for data and header channels and combining the data and header check codes to form a combined check code.
Figure 9:
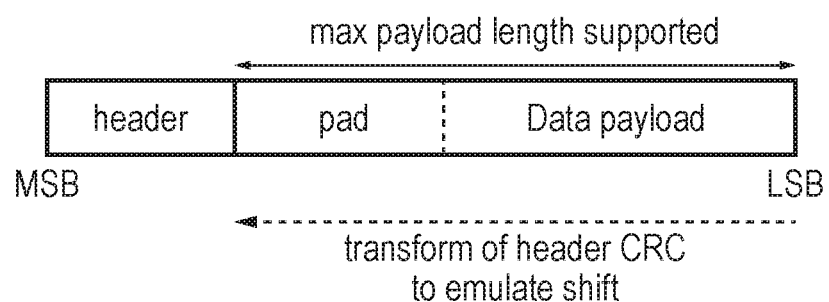
FIGS. 9 and 10 illustrates alternative ways of generating a combined check code.
Figure 10:
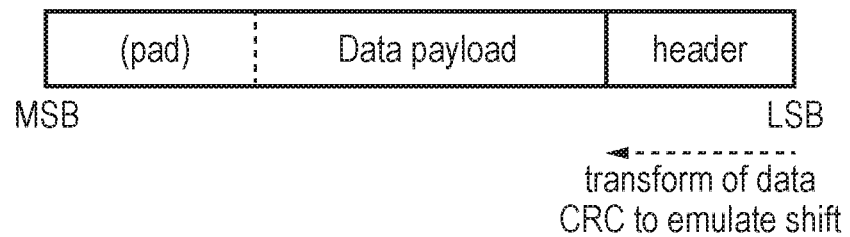

FIGS. 8 to 10 illustrate a further feature of the check code calculation which may be used in cases where the communication protocol used between the requesting node and the source endpoint provides a header value and a data value for the transmission across separate channels 160, 162. Note that the header transmitted on the header channel 160 may be different to the packet header 124 used in the protocol within the interconnection network. For example the header channel 160 in the bus protocol used by the requesting node (e.g. the coherency protocol used by the coherent interconnect 4) may provide a memory address and other data characterising the memory access to be performed. In contrast, the packet header 124 in the network protocol may specify the packet format and information for controlling routing through the NoC 6. The header information received on the header channel 160 may be included as part of the payload data within the general transport protocol format used on the NoC 6.

As shown in FIGS. 9 and 10, when a single check code 112 is to be derived from both the header channel 160 and the data channel 162, the resulting check code should either assume that the data channel 162 is processed first (FIG. 9) or the header channel is processed first (FIG. 10). Either way, applying the CRC calculation in a sliding manner to first one of the header and the data, and then the other of the header and the data would give the same result as if the header and data had been coalesced to form a single data value with one of the header and data at more significant bit positions than the other. In FIG. 9, the header is shifted to more significant bit positions than the data, while in FIG. 10 it is the other way round and the data is shifted to more significant bit positions than the header. As shown in FIG. 9, if the data payload received on the data channel 162 can have variable size, then to ensure a deterministic calculation of the CRC invariant to the data size, the data can be padded with zeroes if the data size is less than the maximum size supported, so that the header always starts at the same bit position regardless of the data size. Such padding is not required in FIG. 10 if the header is always a fixed size. However, in other examples where the header can have a variable size then the header may also be padded to the maximum size supported in the example of FIG. 10.

One approach to calculating the CRC based on information from both the header channel 160 and the data channel 162 could be to apply the CRC calculation sequentially in a sliding manner, first to the one of the data/header which is shown at the less significant bit positions in FIGS. 9 and 10, and then to the other of the data/header which is shown at the more significant bit positions. However, a problem with doing this calculation sequentially is that this is very slow, hurting latency and bandwidth so this may not be acceptable for some implementations.

Instead, as shown in FIG. 8, the combined CRC (first check code) 112 can be calculated in a parallel manner. A separate data check code and header check code are calculated in parallel, based on the information from the data channel 162 and header channel 160 respectively. Subsequently, an XOR gate 174 (or adder) adds the data check code and header check code to form the combined first check code 112. As shown in the equation below, the effective shift required for the one of the data/header that is at the more significant bit position in the combined data/header value of FIGS. 9 and 10 can be emulated by a matrix multiplication in one of the data/header check code calculation circuits 170, 172:

$$CRC(D_{packet}) = CRC(x^p \cdot D_{ms} + D_{ls}) = \quad \text{(Equation 2)}$$
$$CRC(x^p \cdot D_{ms}) + CRC(D_{ls}) = F^p \cdot CRC(D_{ms}) + CRC(D_{ls})$$

Where:
$D_{packet}$ is the combined packet data to be generated for the downstream network based on the data/header channels (e.g. as shown in FIGS. 9 and 10)
$D_{ms}$ is the information from the one of the data channel 162 and header channel 160 that is provided at the most significant bit positions in the combined packet data (e.g. the header in FIG. 9, or the payload data in FIG. 10).
$D_{ls}$ is the information from the one of the data channel 162 and header channel 160 that is provided at the least significant bit positions in the combined packet data (e.g. the payload data in FIG. 9, or the header in FIG. 10).
$x^p$ is the amount by which $D_{ms}$ needs to be shifted to reach the appropriate most significant bit position (e.g. $x^p$ may equal $2^n$ where n is the maximum number of bits possible in $D_{ls}$.
$F^p$ is a binary matrix constant for shifting in $x^p$ zeroes.

To implement Equation 2, as shown in FIG. 8, each of the data/header CRC calculating circuits 170, 172 receives as inputs the data/header data and a corresponding matrix constant. For the one of the data/header circuits 170, 172 that corresponds to $D_{ms}$, the supplied data/header matrix may include consideration of the matrix constant $F^p$ for emulating the shift as part of the CRC calculation. The XOR gate 174 combines the outputs of the two CRC calculating circuits 170, 172 to represent the addition in Equation 2 above, so that the output is the combined CRC 112 to be used as the first check code in the redundant payload of the network.

In other words, the use of the additional matrix constant $F^p$ at one of the CRC calculating circuits 170, 172 effectively transforms one of the data channel check code and the header channel check code into a transformed check code corresponding to a shifted check code which would have been generated had the source endpoint calculated one of the data channel check code and the header channel check code after shifting one of the data and the header to bit positions more significant than a most significant bit of the other of the data and the header.

Hence, with this approach more of the CRC approach can be performed in parallel to reduce latency and improve performance and bandwidth. Regardless of whether the data or header is at the less significant end of the combined value, by using the parallel approach the latency can be reduced and hence performance improved.

The approach shown in FIG. 8 can be useful when the header channel information 160 always comprises a single flit. If the header could include multiple flits then the last header flit may use a different matrix value to the other header flits, in which case additional logic to multiplex between the different values of the header flit matrix can be provided.

Figure 11:
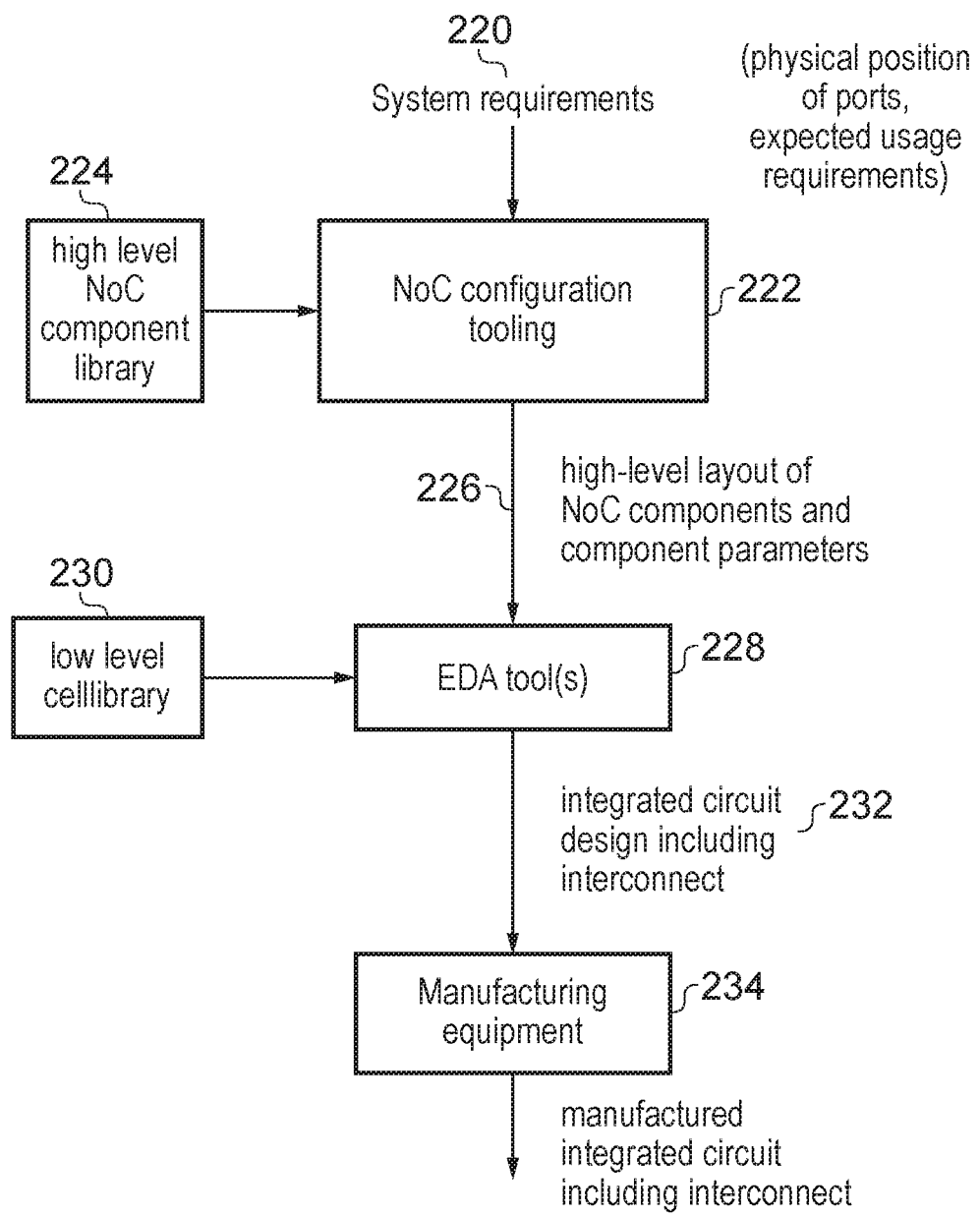
FIG. 11 schematically illustrates design and manufacture of an integrated circuit including an interconnection network.

FIG. 11 schematically illustrates an example of an electronic design process which may use automated design techniques to simplify the design process. A system designer or an electronic design tool performing an earlier stage of the design process may specify various system requirements 220, such as the physical position of the ports 46, 48 to be used for the integrated circuits interconnect, and/or expected usage requirements (e.g. which pairs of ports are likely to require communication links between them and the expected level of bandwidth for different pairs of ports depending on expected data traffic or prioritisation of different masters relative to each other). A NoC configuration tooling program 222 executed on a data processing apparatus may use the system requirements, together with a component library 224 providing a high level representation of the various NoC components which can be selected for assembling the NoC, to generate an electronic design file 226 which provides a high level layout of the NoC components and specifies various parameters of those components such as parameters for configuring the particular properties of the components.

For example, the component library 224 could specify a range of components, such as the ingress port 46, egress port 48, routers 54, or resizers 70 and corresponding redundant network components as discussed above with respect to FIG. 2. For some of these types of component, multiple alternative types could be specified in the component library for selection depending on the particular needs of the system requirements. Alternatively a single type of component could be provided but the NoC configuration tooling 222 may specify, as properties of a given component, certain variables which may tune behaviour of a given component of the NoC or control how that component is manufactured. For example, the parameters for an ingress port could specify the size of the interface with the corresponding requesting node, a subset of destination ports for which routing of network traffic is expected to be needed, a packet format to be used for packets routed to particular destinations, etc. The NoC configuration tooling 222 may determine such requirements based on the system requirements that were input. Part of the NoC configuration function may be to lay out the high level configuration of the redundant network to be provided for functional safety checking, the check code generation at the ingress port and the error checking logic to be provided at the egress port. For example, a special "functional safety providing" version of the ingress port 46 and egress port 48 may be selected (as opposed to alternative versions of the ingress port 46 and egress port 48 which may be selected when generating a NoC design for a system not requiring functional safety). Similar decisions could be activated for other network components, depending on the level of functional safety specified as being required in the system requirements 220.

The high level layout file 226 generated by the NoC configuration tooling 222 is provided to an electronic design automation (EDA) tool 228 which uses a low level cell library 230 specifying standard cells of integrated circuit components at a more detailed level than the NoC component library 224, and generates an integrated circuit design file 232 which specifies the particular gates or transistors to be generated for the integrated circuit which includes the interconnect designed by the NOC configuration tooling 222. In some cases the EDA 228 may actually comprise a number of tools which gradually iterate the design to produce more and more detailed circuit-level representations. The EDA tools 228 may also carry out timing analysis to check whether the designed circuit would meet its timing requirements (testing for setup and hold violations for example), and may iterate the design if earlier attempts fail the timing analysis. The eventually prepared integrated circuit design represented by the design file 232 is the provided to a manufacturer who uses the design file to control manufacturing equipment 234 to manufacture the integrated circuit with the required connections between transistors in order to implement an integrated circuit including the interconnect.

Figure 12:
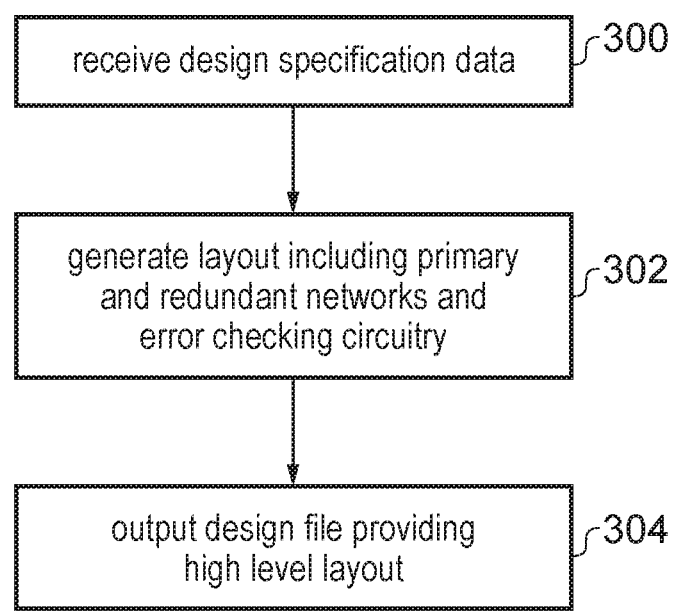
FIG. 12 is a flow diagram illustrating a method of generating an electronic design file representing a design of an interconnection network.

FIG. 12 shows a flow diagram illustrating a method of generating an electronic design file representing a design of an interconnection network, such as the system interconnect (NoC) 6 discussed above. At step 300 the system tooling is provided with design specification data defining the properties of the interconnection network to be generated. For example the design specification data may specify the number of nodes to be connected using the network, the data width of the channels used by each of those nodes, expected usage requirements (such as levels of service or bandwidth required for particular combinations of requesting node and destination node) and the level of functional safety required (e.g. specifying one of the ASIL functional safety classifications required, e.g. level C or level D). In response to the design specification data, at step 302 the system tooling 222 generates a high level layout for the network, e.g. including an arrangement of routers, resizers or other components defining the primary network and redundant network so as to provide the requirements specified by the design specification data. The design may include components which implement the redundant network and are designated as providing the logic for generating and checking the error check codes as discussed above (either explicitly in the high-level layout information 226 generated by the tooling, or implicitly in the sense that the selected cell type specified in the high-level layout corresponds to a cell in the cell library 230 which has been given an integrated circuit design which will implement these functional safety features). The high level layout specifies the components to be generated at a relatively abstract level, for example merely specifying identifiers of the cell type to be provided and optionally one or more configuration parameters for adjusting properties of that component, but not necessarily specifying the exact transistor level layout to be generated for that component. At step 304 the design file identifying the high level layout is output. This could then be input to an EDA tool 228 using a standard cell library 230 to provide the specific gate-level design for each of the high level components indicated by the system tooling 222 in the design file 228, to generate the specific integrated circuit design 232 which can then be used for manufacturing the circuit.

Further example arrangements are set out in the following clauses:

(1) An interconnection network for providing data transfer between a plurality of nodes of an integrated circuit, comprising:

a plurality of endpoints each to exchange data with a respective node of the integrated circuit;

a primary network to route a primary payload from a source endpoint to a destination endpoint;

a redundant network to route, to the destination endpoint, a redundant payload comprising a first check code calculated based on at least a portion of the primary payload, the first check code having fewer bits than said at least a portion of the primary payload; wherein the destination endpoint comprises error checking circuitry to perform an error checking operation to calculate a second check code based on the primary payload received via the primary network, and verify integrity of the primary payload based on a comparison of the second check code with the first check code received via the redundant network.

(2) The interconnection network according to clause (1), wherein the primary payload comprises a packet comprising a variable number of flits of variable size.

(3) The interconnection network according to clause (2), wherein the redundant network is configured to transmit a redundant packet of the redundant payload comprising the same number of flits as a corresponding primary packet of the primary payload.

(4) The interconnection network according to clause (3), wherein when the number of flits of the primary payload is greater than a minimum number of flits required to transmit the redundant payload, the source endpoint is configured to include in the redundant payload at least one padding flit providing dummy data or non-redundantly transmitted data independent of the data of the primary payload.

(5) The interconnection network according to clause (1), wherein the source endpoint is configured to receive, from a corresponding source node of the integrated circuit, data on a data channel and a header on a header channel, and to combine the data and the header to form the primary payload; and the source endpoint is configured to calculate a data channel check code based on the data received on the data channel and a header channel check code based on the header received on the header channel, and to combine the data channel check code and the header channel check code to form the first check code.

(6). The interconnection network according to clause (5), wherein the source endpoint is configured to transform one of the data channel check code and the header channel check code to generate a transformed check code corresponding to a shifted check code which would have been generated had the source endpoint calculated said one of the data channel check code and the header channel check code after shifting one of the data and the header to bit positions more significant than a most significant bit of the other of the data and the header, and to form the first check code based on said transformed check code and the other of the data channel check code and the header channel check code.

In the present application, the words "configured to . . . " are used to mean that an element of an apparatus has a configuration able to carry out the defined operation. In this context, a "configuration" means an arrangement or manner of interconnection of hardware or software. For example, the apparatus may have dedicated hardware which provides the defined operation, or a processor or other processing device may be programmed to perform the function. "Configured to" does not imply that the apparatus element needs to be changed in any way in order to provide the defined operation.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. An interconnection network for providing data transfer between a plurality of nodes of an integrated circuit, comprising:

a plurality of endpoints each to exchange data with a respective node of the integrated circuit;

a primary network to route a primary payload from a source endpoint to a destination endpoint;

a redundant network to route, to the destination endpoint, a redundant payload comprising a first check code calculated based on at least a portion of the primary payload, the first check code having fewer bits than said at least a portion of the primary payload;

wherein the destination endpoint comprises error checking circuitry to perform an error checking operation to calculate a second check code based on the primary payload received via the primary network, and verify integrity of the primary payload based on a comparison of the second check code with the first check code received via the redundant network, wherein the redundant network comprises at least one intermediate component each configured to route the redundant payload from an upstream component to a downstream component;

wherein at least for a synchronous intermediate component for which both the upstream component and the downstream component are configured to operate in response to synchronous clock signals, the synchronous intermediate component is configured to route the redundant payload from the upstream component to the downstream component independent of any comparison of the redundant payload with information derived from the primary payload transmitted on the primary network.

2. The interconnection network according to claim 1, wherein the primary network and the redundant network comprise first and second virtual channels on the same physical channel.

3. The interconnection network according to claim 1, wherein the redundant network is configured to delay transmission of the redundant payload relative to transmission of the primary payload on the primary network.

4. The interconnection network according to claim 1, wherein the primary network comprises a portion comprising components clocked by a first clock signal; and the redundant network comprises a portion comprising components clocked by a second clock signal independent from, and synchronous with, the first clock signal.

5. The interconnection network according to claim 1, wherein the primary payload comprises network control signals for controlling components of the primary network to route the primary payload from the source endpoint to the destination endpoint; and the redundant payload comprises a subset of the network control signals for controlling components of the redundant network to route the redundant payload from the source endpoint to the destination endpoint.

6. The interconnection network according to claim 5, wherein the error checking operation is independent of at least one of the network control signals transmitted in the primary payload.

7. The interconnection network according to claim 1, wherein the primary payload comprises a packet comprising a variable number of flits of variable size.

8. The interconnection network according to claim 7, wherein the primary network comprises at least one resizing component to resize flits of the primary payload to flits of a different size.

9. The interconnection network according to claim 7, wherein the source endpoint is configured to calculate the first check code as a packet check code for checking contents of the entire packet.

10. The interconnection network according to claim 7, wherein the source endpoint is configured to calculate, as the first check code, a check code which, for a given volume of data to be transmitted in the packet, is invariant to the number of flits used to transmit said given volume of data in the packet.

11. The interconnection network according to claim 7, wherein each flit of the primary payload comprises a variable number of flit sections, the primary payload specifies flit section validity information indicating which flit sections comprise valid information.

12. The interconnection network according to claim 11, wherein the source endpoint is configured to omit invalid flit sections from a calculation of the first check code.

13. The interconnection network according to claim 12, wherein the source endpoint comprises coalescing circuitry to coalesce valid flit sections of a given flit into a contiguous block of data for input to a calculation of the first check code.

14. The interconnection network according to claim 11, wherein each flit of the redundant payload comprises a single flit section regardless of the number of flit sections in each flit of the primary payload.

15. The interconnection network according to claim 1, wherein the first check code and the second check code comprise a type of check code capable of detecting multi-bit errors in the primary payload or the redundant payload.

16. The interconnection network according to claim 1, wherein the first check code and the second check code comprise a cyclic redundancy check (CRC) code.

17. A non-transitory storage medium storing an electronic design file representing a design of an interconnection network according to claim 1.

18. A computer-implemented method of generating an electronic design file representing a design of an interconnection network for providing data transfer between nodes of an integrated circuit; the method comprising:
in response to design specification data identifying the nodes to be connected by the interconnection network, generating the electronic design file specifying that the interconnection network comprises:
a plurality of endpoints each to exchange data with a respective node of the integrated circuit;
a primary network to route a primary payload from a source endpoint to a destination endpoint; and
a redundant network to route, to the destination endpoint, a redundant payload comprising a first check code calculated based on at least a portion of the primary payload, the first check code having fewer bits than said at least a portion of the primary payload;
wherein the destination endpoint comprises error checking circuitry to perform an error checking operation to calculate a second check code based on the primary payload received via the primary network, compare the second check code with the first check code received via the redundant network, and signal an error when a mismatch is detected between the first check code and the second check code,
wherein the redundant network comprises at least one intermediate component each configured to route the redundant payload from an upstream component to a downstream component;
wherein at least for a synchronous intermediate component for which both the upstream component and the downstream component are configured to operate in response to synchronous clock signals, the synchronous intermediate component is configured to route the redundant payload from the upstream component to the downstream component independent of any comparison of the redundant payload with information derived from the primary payload transmitted on the primary network.

19. A non-transitory storage medium storing a computer program for controlling a data processing apparatus to perform the method of claim 18.

* * * * *